US00RE43215E

(19) United States
(12) Reissued Patent
Ker et al.

(10) Patent Number: US RE43,215 E
(45) Date of Reissued Patent: Feb. 28, 2012

(54) ESD PROTECTION DESIGN WITH TURN-ON RESTRAINING METHOD AND STRUCTURES

(76) Inventors: Ming-Dou Ker, Hsinchu (TW); Jeng-Jie Peng, Tao-Yuan (TW); Hsin-Chin Jiang, Taipei (TW)

(21) Appl. No.: 11/598,154

(22) Filed: Nov. 9, 2006
(Under 37 CFR 1.47)

Related U.S. Patent Documents

Reissue of:
(64) Patent No.: 6,815,775
Issued: Nov. 9, 2004
Appl. No.: 09/773,754
Filed: Feb. 2, 2001

(51) Int. Cl.
*H01L 23/62* (2006.01)

(52) U.S. Cl. ..... 257/355; 257/356; 257/357; 257/360; 257/362; 257/E23.105; 257/E23.111

(58) Field of Classification Search ..... 257/355–360, 257/362–363
See application file for complete search history.

(56) References Cited

U.S. PATENT DOCUMENTS

| | | | | |
|---|---|---|---|---|
| 4,805,008 | A | 2/1989 | Yao et al. | |
| 4,855,620 | A | 8/1989 | Duvvury et al. | |
| 5,043,782 | A | 8/1991 | Avery | |
| 5,086,365 | A | 2/1992 | Lien | |
| 5,239,194 | A | 8/1993 | Ohtani et al. | |
| 5,374,565 | A | 12/1994 | Hsue et al. | |
| 5,477,407 | A * | 12/1995 | Kobayashi et al. | 361/56 |
| 5,495,118 | A | 2/1996 | Kinoshita et al. | |
| 5,539,327 | A | 7/1996 | Shigehara et al. | |
| 5,581,104 | A | 12/1996 | Lowrey et al. | |
| 5,623,387 | A * | 4/1997 | Li et al. | 361/56 |
| 5,631,793 | A | 5/1997 | Ker et al. | |
| 5,637,900 | A | 6/1997 | Ker et al. | |
| 5,674,761 | A | 10/1997 | Chang et al. | |
| 5,731,614 | A | 3/1998 | Ham | |
| 5,763,918 | A * | 6/1998 | El-Kareh et al. | 257/355 |
| 5,818,088 | A | 10/1998 | Ellis | |
| 5,838,050 | A * | 11/1998 | Ker et al. | 257/401 |
| 5,874,763 | A | 2/1999 | Ham | |
| 5,898,206 | A | 4/1999 | Yamamoto | |
| 5,925,913 | A * | 7/1999 | Draper | 257/344 |
| 5,962,899 | A * | 10/1999 | Yang et al. | 257/360 |
| 6,034,552 | A | 3/2000 | Chang et al. | |
| 6,057,579 | A | 5/2000 | Hsu et al. | |
| 6,072,219 | A | 6/2000 | Ker et al. | |
| 6,097,066 | A * | 8/2000 | Lee et al. | 257/355 |
| 6,211,554 | B1 * | 4/2001 | Whitney | 257/355 |
| 6,306,695 | B1 | 10/2001 | Lee et al. | |
| 6,320,231 | B1 * | 11/2001 | Ikehashi et al. | 257/355 |
| 6,323,074 | B1 | 11/2001 | Jiang et al. | |
| 6,329,694 | B1 * | 12/2001 | Lee et al. | 257/372 |
| 6,410,965 | B1 * | 6/2002 | Yu | 257/356 |

(Continued)

FOREIGN PATENT DOCUMENTS

JP 5 3173 * 1/1993

(Continued)

*Primary Examiner* — A. Sefer

(57) ABSTRACT

The present invention is directed to an electrostatic discharge (ESD) device with an improved ESD robustness for protecting output buffers in I/O cell libraries. The ESD device according to the present invention uses a novel I/O cell layout structure for implementing a turn-on restrained method that reduces the turn-on speed of an ESD guarded MOS transistor by adding a pick-up diffusion region and/or varying channel lengths in the layout structure.

10 Claims, 25 Drawing Sheets

U.S. PATENT DOCUMENTS

| | | | | |
|---|---|---|---|---|
| 6,420,221 | B1 | 7/2002 | Lee et al. | |
| 6,424,585 | B1 * | 7/2002 | Ooishi | 365/226 |
| 6,455,898 | B1 * | 9/2002 | Liu et al. | 257/360 |
| 6,469,354 | B1 | 10/2002 | Hirata | |
| 6,501,136 | B1 * | 12/2002 | Lin | 257/355 |
| 6,509,617 | B2 * | 1/2003 | Hiraga | 257/409 |
| 6,559,508 | B1 | 5/2003 | Lin et al. | |
| 6,566,715 | B1 * | 5/2003 | Ker et al. | 257/355 |
| 6,583,972 | B2 | 6/2003 | Verhaege et al. | |
| 6,639,283 | B1 * | 10/2003 | Hung et al. | 257/355 |
| 6,646,840 | B1 * | 11/2003 | Sugerman et al. | 361/56 |
| 2002/0033507 | A1 * | 3/2002 | Verhaege et al. | 257/360 |

FOREIGN PATENT DOCUMENTS

| | | | |
|---|---|---|---|
| JP | 5-3173 | * | 1/1993 |
| JP | 8-279564 | * | 10/1996 |
| JP | 10-229132 | | 8/1998 |
| JP | 11-274404 | * | 8/1999 |
| JP | 11-274404 | | 10/1999 |
| JP | 2000-277700 | | 10/2000 |
| JP | 2001-77305 | | 3/2001 |
| JP | 5-3173 | | 1/2005 |
| WO | 91/05371 | | 4/1991 |
| WO | WO 91/05371 | * | 4/1991 |

* cited by examiner

ESD PROTECTION DESIGN WITH TURN-ON RESTRAINING METHOD AND STRUCTURES

Matter enclosed in heavy brackets [ ] appears in the original patent but forms no part of this reissue specification; matter printed in italics indicates the additions made by reissue.

BACKGROUND OF THE INVENTION

1. Field of the Invention

The present invention is directed generally to electrostatic discharge (ESD) protection circuits for input/output (I/O) devices, and more particularly, to improving ESD robustness in I/O cell libraries using novel layout techniques to implement a turn-on retraining arrangement that reduces the turn-on speed or increases the breakdown voltage of a MOS transistor.

2. Description of the Related Art

The ESD robustness of CMOS integrated circuits (IC) has been found to be seriously degraded due to deep-submicron CMOS technologies. To improve the ESD robustness of the output transistors, the ESD-implant process and the silicide-blocking process have been widely implemented in the deep-submicron CMOS technologies. In addition to the process modification to improve the ESD robustness of the output buffers, the symmetrical layout structure had been emphasized to realize the large-dimension output transistors by ensuring the uniform turn-on phenomenon along the multiple fingers of the output transistor. To further enhance the uniform turn-on phenomenon among the multiple fingers of the output transistors, a gate-coupling design had been reported to achieve uniform ESD power distribution on large-dimension output transistors.

General circuit diagrams of the output cell, input cell, and I/O bidirectional cell in a cell library are shown in FIGS. 1(a)-(c), respectively. In a general application, the output buffers in a cell library have different driving specifications. For instance, the output buffers in a typical library may have the different driving capabilities of e.g., 2 mA, 4 mA, 8 mA, or 24 mA. To meet these different types of current specification, different numbers of fingers in the MOS device of the cell are provided to drive current to, or sink current from, the pad. An example of the finger numbers of the different I/O cells in a 0.35-μm cell library used to provide the driving/sinking current are shown in TABLE 1.

TABLE 1

| Current | Finger Number | | | |
|---|---|---|---|---|
| Specification | xp | xn | yp | yn |
| input cell | 0 | 0 | 14 | 14 |
| 4 mA | 2 | 1 | 12 | 13 |
| 8 mA | 4 | 2 | 10 | 12 |
| 10 mA | 5 | 3 | 9 | 11 |
| 14 mA | 7 | 4 | 7 | 10 |
| 18 mA | 9 | 5 | 5 | 9 |
| 24 mA | 12 | 6 | 2 | 8 |

Wherein W/L=35 μm/0.5 μm for each finger, and the xp (xn) is the number of fingers in the output PMOS (NMOS) layout, which are used to generate the output current to the pad.

However, the cell layouts of the output buffers with different driving capabilities are all drawn in the same layout style and area for programmable application. To adjust different output sinking (driving) currents of the output buffer, different number of fingers of the poly gates in the output NMOS (PMOS) are connected to the ground (VDD). The general layout of the NMOS device in the output cell with the used and unused fingers is shown in FIG. 2(a). The schematic circuit diagram of the layout of FIG. 2(a) is shown in FIG. 2(b), where the used NMOS finger is marked as Mn1 and the unused MOS fingers are lumped as Mn2. To provide a small output current, only a poly gate (used MOS finger) is connected to the pre-buffer circuit to control the NMOS (PMOS) on or off. The other poly gates are connected to VSS (VDD) to keep them off in the layout of FIG. 2(a). Such layout structure has been widely used in IC products, especially in the digital IC's.

Due to the asymmetrical connection on the poly-gate fingers of the output NMOS in the layout, the ESD turn-on phenomenon among the fingers becomes quite different even if the layout is still symmetrical. When such an I/O cell with a small output current driving ability is stressed by ESD, the used NMOS Mn1 is often turned on first due to the transient coupled voltage on its gate. As seen in FIG. 2(b), the ESD voltage applied to the pad is coupled to the gate of Mn1 and Mn2 by the parasitic drain-to-gate overlapped capacitance (see the dashed line as shown in FIG. 2(b)). The coupled gate voltage is kept at the gate of Mn1 by the pre-buffer circuit, but the coupled voltage at the gate of Mn2 is conducted to VSS. Therefore, the Mn2 (with larger device dimension which is designed to protect Mn1) still remains off but the Mn1 (with a smaller device dimension) is turned on to bypass the ESD current from the pad to VSS. This generally causes a very low ESD level for the output buffer, even the output buffer has a large device dimension in total (Mn1+Mn2).

The human body model (HBM) ESD level of an I/O cell library with different driving current specification but the same layout area and layout style is shown in TABLE 2.

TABLE 2

| HBM ESD Stress | 2 mA Buffer | 4 mA Buffer | 8 mA Buffer | 12 mA Buffer | 24 mA Buffer |
|---|---|---|---|---|---|
| VDD (−) ND Mode | 1.5 KV | 2 KV | 2.5 KV | >2.5 KV | >2.5 KV |
| VSS (+) PS Mode | 1.0 KV | 1.5 KV | 2.0 KV | >2.5 KV | >2.5 KV |

The test data for two worst cases of ESD-testing pin combinations under the PS-mode ESD test and ND-mode ESD test are listed in Table 2 for the I/O cells with different output current specifications. According to the data of Table 2, it is concluded that when the output cell has a higher output current driving ability, the ESD level is also higher. However, the I/O cell with an output current of 2 mA only has an ESD level of 1 kV, even if the total (Mn1+Mn2) device dimension in every cell is the same. To verify the location of ESD damage on the I/O cell with a smaller output current, the ESD-stressed IC was de-layered to find the failure location.

The failure locations were found to locate at the Mn1 device of the I/O cell. However, the Mn2 in the same I/O cell was not damaged by the ESD stress. The detailed analysis on this failure issue is described in the paper by H. -H. Chang, M. -D. Ker and J. -C. Wu, "Design of dynamic-floating-gate technique for output ESD protection in deep-submicron CMOS technology," Solid-State Electronics, vol. 43, pp. 375-393, February 1999. This creates a challenge to provide one set of I/O cells with better ESD level. Typically, the HBM ESD level of every I/O cell should be greater than 2 kV under any ESD-testing pin combination.

To improve ESD level of the I/O cells with different output current driving abilities, the descriptions of the gate-coupled technologies had been reported in publications by, e.g., C. Duvvury and R. N. Rountree, "Output buffer with improved ESD protection," U.S. Pat. No. 4,855,620 (August, 1989); C.-D. Lien, "Electrostatic discharge protection circuit," U.S. Pat. No. 5,086,365 (February, 1992) M.-D. Ker, C.-Y Wu, T. Cheng, C.-N. Wu, and T.-L. Yu, "Capacitor-couple ESD protection circuit for submicron CMOS IC," U.S. Pat. No. 5,631,793 (May, 1997); and H.-H. Chang, M.-D. Ker, K. T. Lee, and W.-H. Huang, "Output ESD protection using dynamic-floating-gate arrangement," U.S. Pat. No. 6,034,552 (March, 2000).

One of such gate-coupled designs is shown in FIG. 3 (U.S. Pat. No. 5,631,793), where the unused Mn2 (Mp2) in the I/O cell with small output current driving ability is connected to VSS (VDD) through the additional resistor Rw2 (Rw1). An additional capacitor Cn (Cp) is added and connected from the pad to the gate of Mn2 (Mp2) to generate the coupling effect. When a positive (negative) ESD voltage in the PS-mode (ND-mode) ESD test condition is applied to the pad, the overstress voltage is coupled to the gate of Mn2 (Mp2) through the added capacitor Cn (Cp). The coupled voltage at the gate of Mn2 (Mp2) is kept longer in time by the resistor Rw2 (Rw1), therefore the unused Mn2 (Mp2) with larger device dimension in the cell layout can be triggered on to discharge the ESD current. So, the gate-coupled technique is used to turn on the Mn2 and Mp2 to discharge ESD current before the Mn1 (Mp1) is damaged by ESD. Because the Mn2 and Mp2 often have much larger device dimensions (channel width of several hundreds of micron), they can sustain a higher ESD stress. The more detailed description on the gate-coupled design is provided in the paper by M.-D. Ker, C.-E. Wu, and H.-H. Chang, "Capacitor-couple ESD protection circuit for deep-submicron low-voltage CMOS ASIC," IEEE Trans. on VLSI Systems, vol. 4, no.3, pp. 307-321, September, 1996.

Another gate-coupled design to enhance the turn-on of Mn2 and Mp2 is shown in FIG. 4 (U.S. Pat. No. 5,086,365). In FIG. 4, the gate of Mn2 (Mp2) is connected to VSS (VDD) through the Mdn1 (Mdp1) device, which works as a resistor to sustain the coupled voltage in the gate of Mn2 (Mp2). Therefore, the Mn2 (Mp2) can be turned on faster than the Mn1 (Mp1). The ESD current is mainly discharged through the unused Mn2 (Mp2) with large device dimension in the I/O cells.

A more complex design, called as the dynamic-floating-gate technique, was also disclosed to improve ESD level of the I/O cells, which is shown in FIG. 5 (U.S. Pat. No. 6,034,552). In this design, a RC circuit is used to delay the turn-on of the Mdn1 (Mdp1), therefore the ESD-transient voltage can be coupled and held at the gate of Mn2 (Mp2) within a much longer time period. So, the Mn2 (Mp2) can be more effectively turned on to discharge the ESD current from the pad to VSS (VDD). The more detailed principle for this design is disclosed in the paper by H.-H. Chang, M.-D. Ker and J.-C. Wu, "Design of dynamic-floating-gate technique for output ESD protection in deep-submicron CMOS technology," Solid-State Electronics, vol. 43, pp.375-393, February. 1999.

The manufacturing process solutions had been also invented for improving the ESD level of such I/O cells. To enhance the turn-on of Mn2, the process method with the additional ESD implantation is also provided to reduce the junction breakdown voltage of the Mn2 device, such as those disclosed in publications by, e.g., C.-C. Hsue and J. Ko, "Method for ESD protection improvement," U.S. Pat. No. 5,374,565, December 1994; T. A. Lowrey and R. W Chance, "Static discharge circuit having low breakdown voltage bipolar clamp," U.S. Pat. No. 5,581,104, December 1996; and K.-Z. Chang and C.-Y Lin, "Method of making ESD protection device structure for low supply voltage applications," U.S. Pat. No. 5,674,761, October 1997.

The NMOS device structure, equivalent circuit, and layout with the additional ESD-implantation method for I/O cells are shown in FIGS. 6(a)-(c), respectively. In FIG. 6(c), the ESD-implantation with a P+ doping concentration is implanted under the drain region of the Mn2 device, but the Mn1 is not implanted. The Mn2 drain to P-well junction with the additional P+ ESD implantation has a lower breakdown voltage. Therefore, the Mn2 can be broken down to discharge ESD current before the Mn1. The ESD current discharging path is shown by the dashed line in FIG. 6(a). To realize this purpose, an additional mask layer is used in the process, and the layout has to be drawn with this ESD-implantation layer. In the layout of FIG. 6(b), the ESD-implantation regions are added at the drain regions of Mn2 fingers, but not on the Mn1 finger. Additional process steps and mask have to be added into the process flow to realize such a design.

When the CMOS technology scaled down to sub-half-micron, the voltage level of VDD in the chip is also reduced to a lower voltage level. Because the I/O signals come from external circuits of chips in a system may have different voltage levels, the high-voltage-tolerant I/O circuits are designed and used in such an interface condition. A typical 3V/5V-tolerant I/O circuit was described in M. Pelgrom and E. Dijkmans, "A 3/5V compatible I/O buffer," in IEEE Journal of Solid-State Circuits, vol. 30, no.7, pp. 823-825, July 1995; and W. Anderson and D. Krakaauer, "ESD protection for mixed-voltage I/O using NMOS transistors staked in a cascade configuration," in Proc. Of EOS/ESD Symp., 1998, pp. 54-62.

The design methodology as taught from the above-discussed prior art is focused exclusively on the unused Mn2 in the I/O cell. Although such design methodology can improve the ESD level of the I/O library, it is costly and requires additional elements to realize the gate-coupled circuit or modifications to lower the junction breakdown voltage.

SUMMARY OF THE INVENTION

It is an object of the present invention to provide a semiconductor structure for ESD protection of an integrated circuit in order to improve ESD level of the I/O cells with different driving specifications.

Another object of the present invention is to provide a semiconductor structure for improving ESD robustness of the output ESD protection NMOS/PMOS through an additional pick-up diffusion region and/or modification of channel length.

A further object of the present invention is to provide a semiconductor structure for improving ESD robustness of the input ESD protection NMOS/PMOS.

A still further object of the present invention is to provide a semiconductor structure to improve ESD robustness of the I/O cells by using different channel lengths in the I/O devices.

In accordance with the present invention, a semiconductor structure for electrostatic discharge (ESD) protection of a metal-oxide semiconductor (MOS) integrated circuit consists of a p-type substrate forming a base for the semiconductor structure, a first n-type channel formed between first N+ regions within the substrate for an Mn1 transistor, and a second n-type channel formed between second N+ regions within the substrate for an Mn2 transistor. In particular, an additional P+ pick-up diffusion region is disposed adjacent to the first N+ regions to reduce the turn-on speed of the first MOS transistor. Alternatively or in addition to the P+ pick-up diffusion region, the channel lengths of the first and second n-typ channels can be varied such that the channel length of the first n-type channel is larger than the channel length of the second n-type channel to increase the drain breakdown voltage of the first MOS transistor.

In accordance with another aspect of the present invention, the semiconductor structure is used to protect an internal circuit, output buffer, I/O buffer, input cell, or 3V/5V-tolerant I/O cell library of the MOS integrated circuit by slowing down the turn-on speed or increasing the break-down voltage of the output device with small driving current ability, such that the ESD-protection device with a large device dimension can be triggered on to bypass ESD current during an ESD stress event. Related aspects and advantages of the invention will become apparent and more readily appreciated from the following detailed description of the invention, taken in conjunction with the accompanying drawings.

DETAILED DESCRIPTION OF THE PREFERRED EMBODIMENTS

The present invention will now be described by way of preferred embodiments with references to the accompanying drawings. Like numerals refer to corresponding parts of various drawings.

Figure 1B:
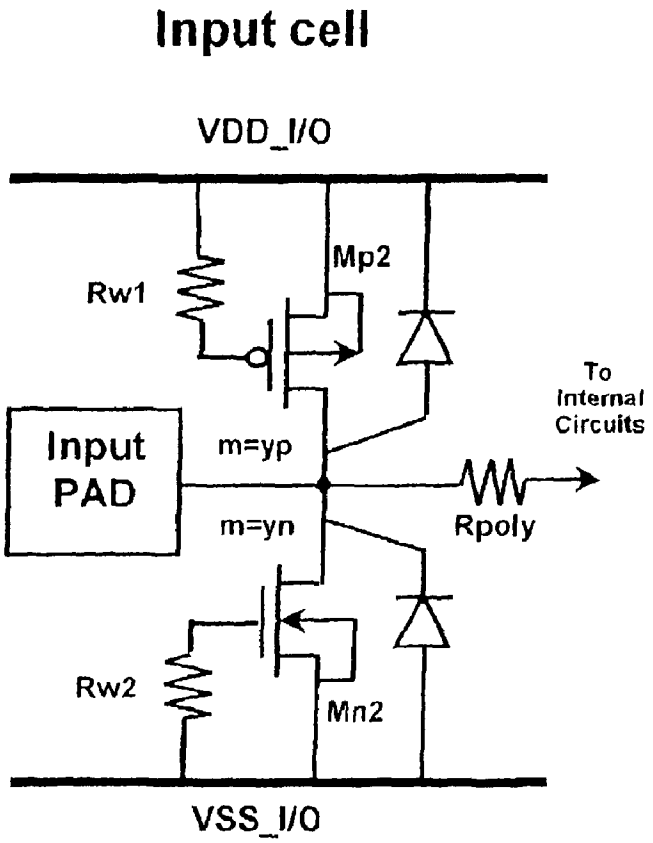
Fig.1(b) Prior Art
FIGS. 1(a)-(c) are schematic circuit block diagrams showing conventional circuit function and device dimension of I/O cells.
Figure 1A:
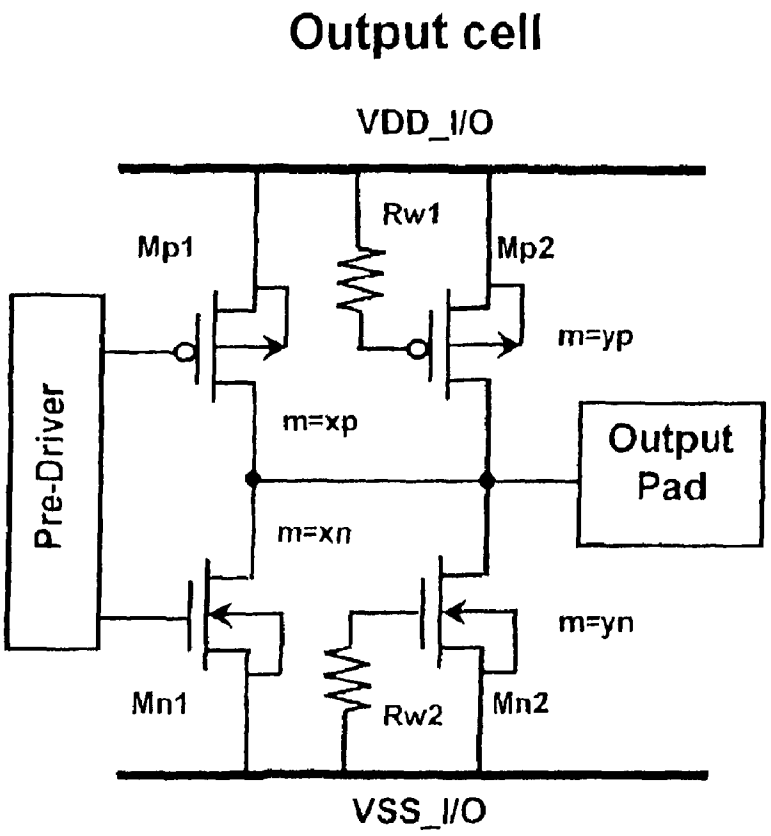
Fig.1(a) Prior Art
Figure 1C:
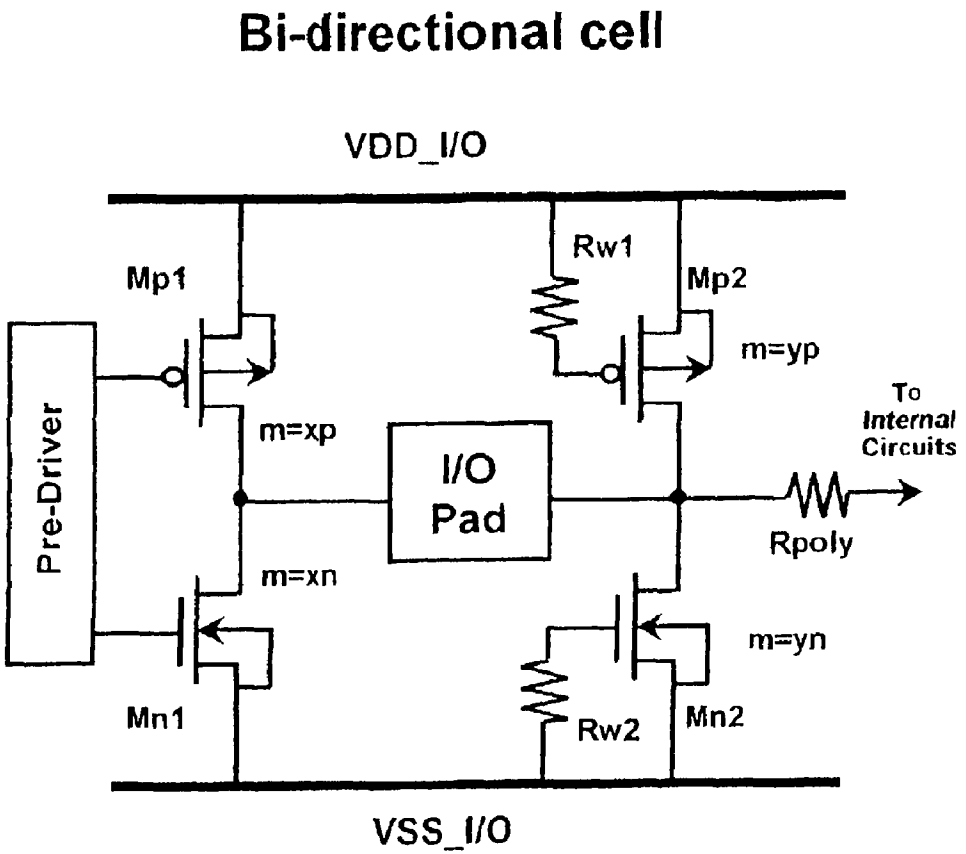
Fig.1(c) Prior Art
Figure 2A:
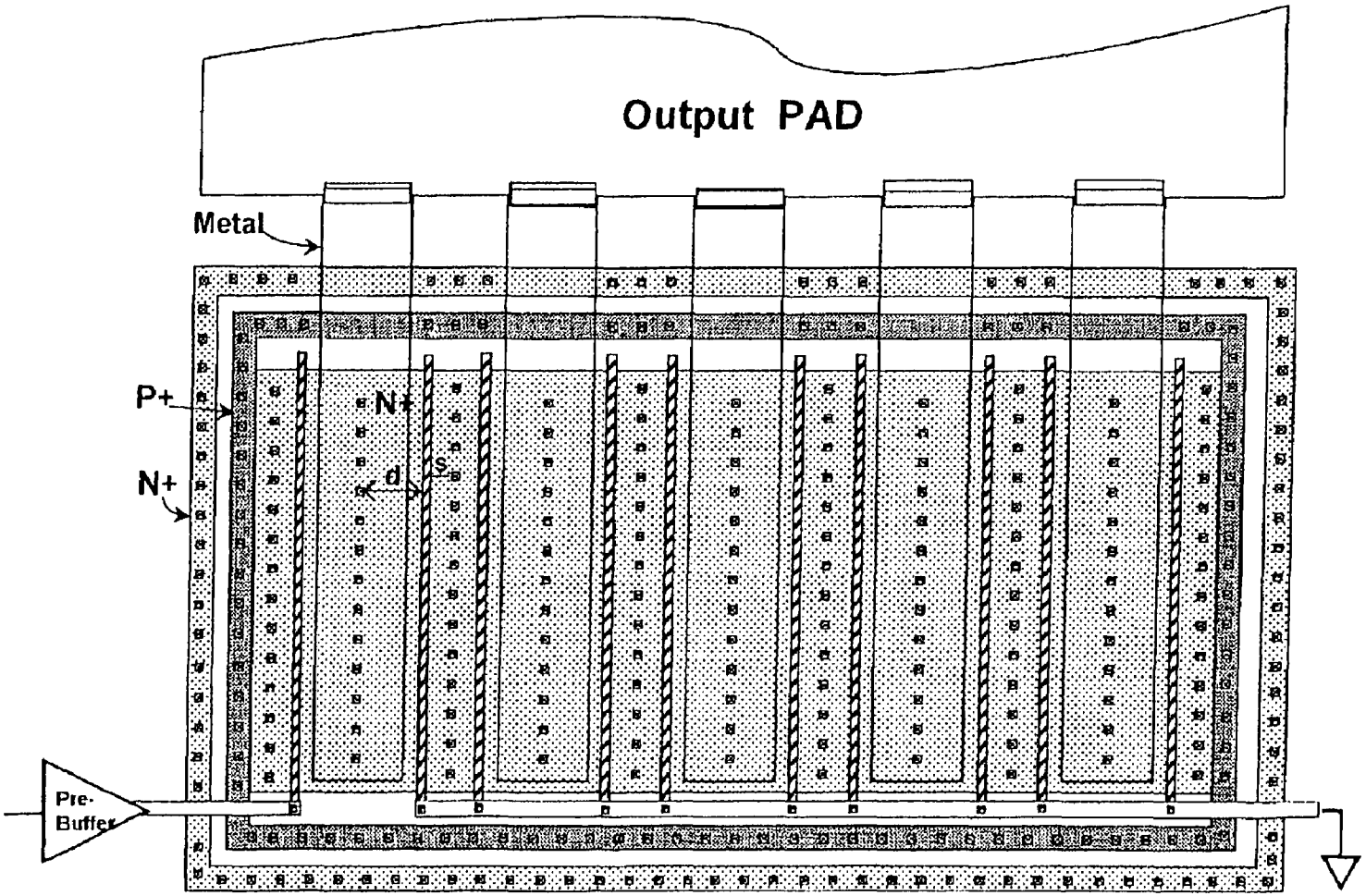
Fig.2(a) Prior Art
FIG. 2(a) is a schematic layout diagram showing a conventional layout of I/O devices with parallel multiple fingers.
Figure 2B:
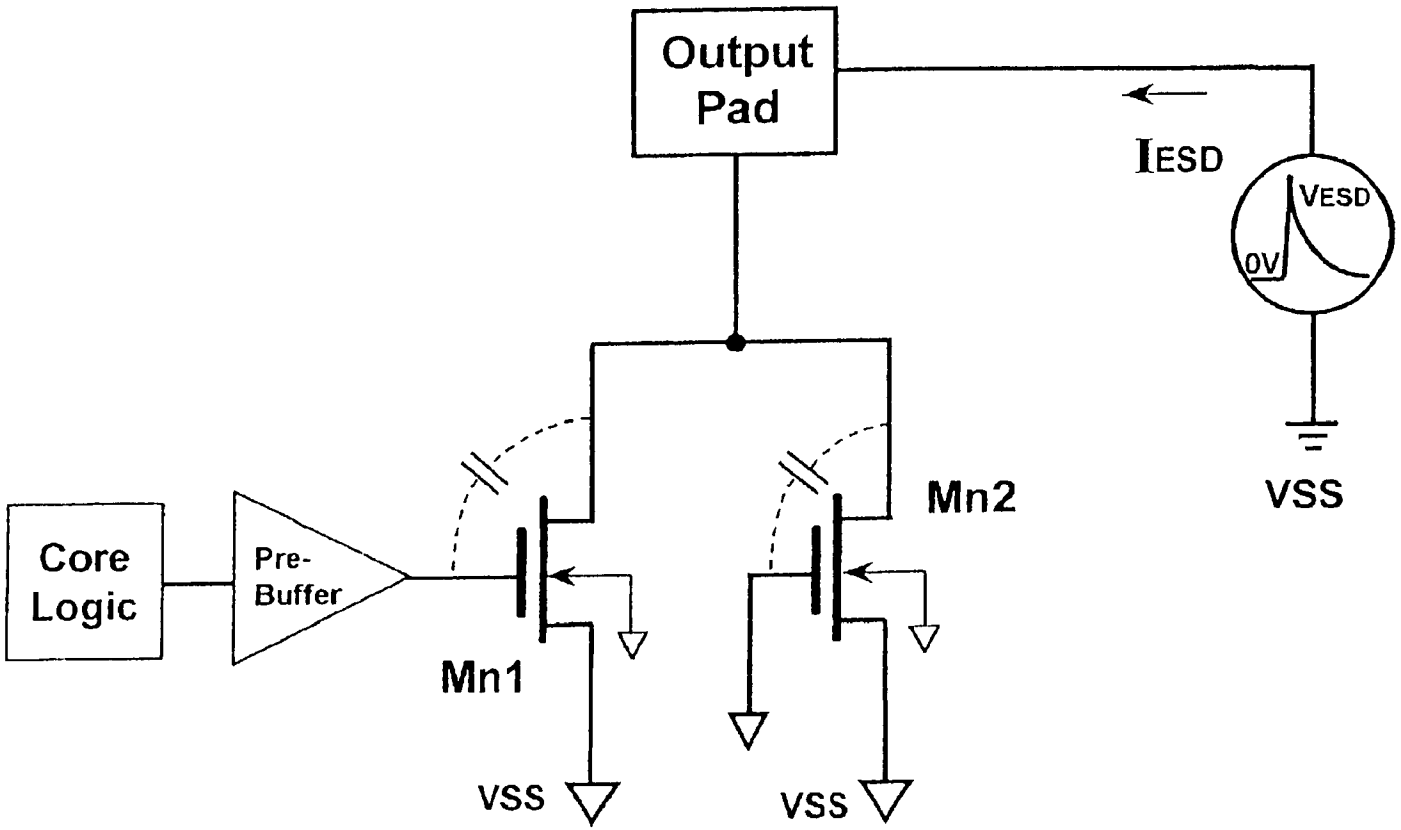
Fig.2(b) Prior Art
FIG. 2(b) is the schematic circuit block diagram of conventional NMOS devices in an output cell with small-driving current.
Figure 4:
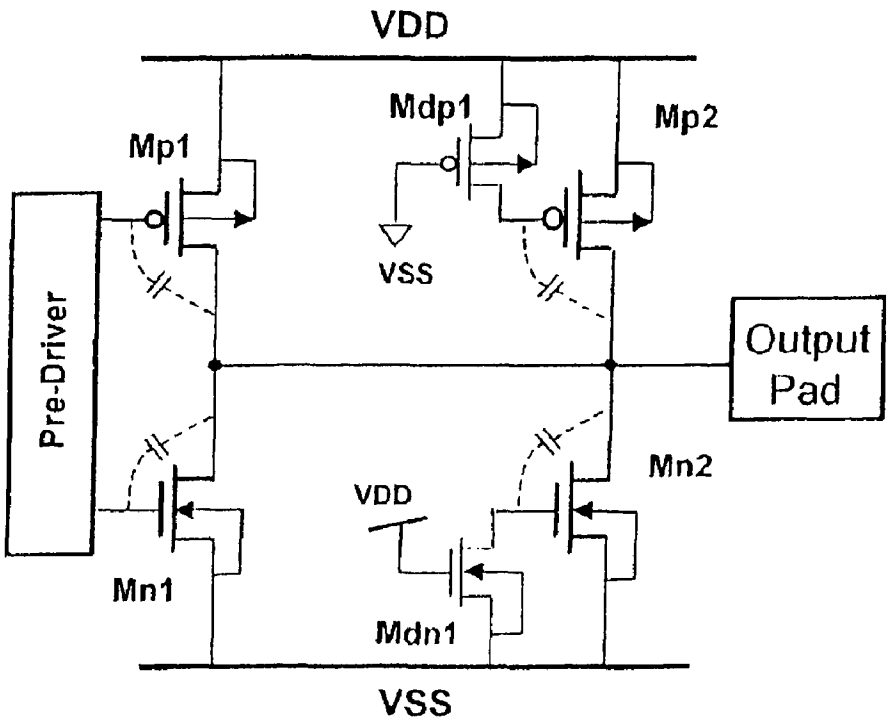
Fig.4 Prior Art
FIG. 4 is a schematic circuit block diagram showing another conventional gate-coupled technique for improving the ESD robustness of a small-driving output buffer.
Figure 3:
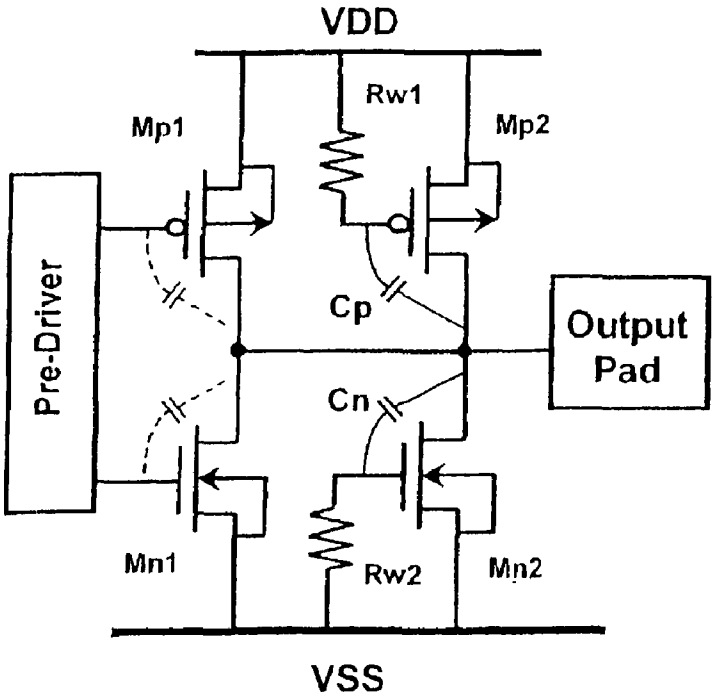
Fig.3 Prior Art
FIG. 3 is a schematic circuit block diagram showing a conventional gate-coupled technique for improving the ESD robustness of a small-driving output buffer.
Figure 5:
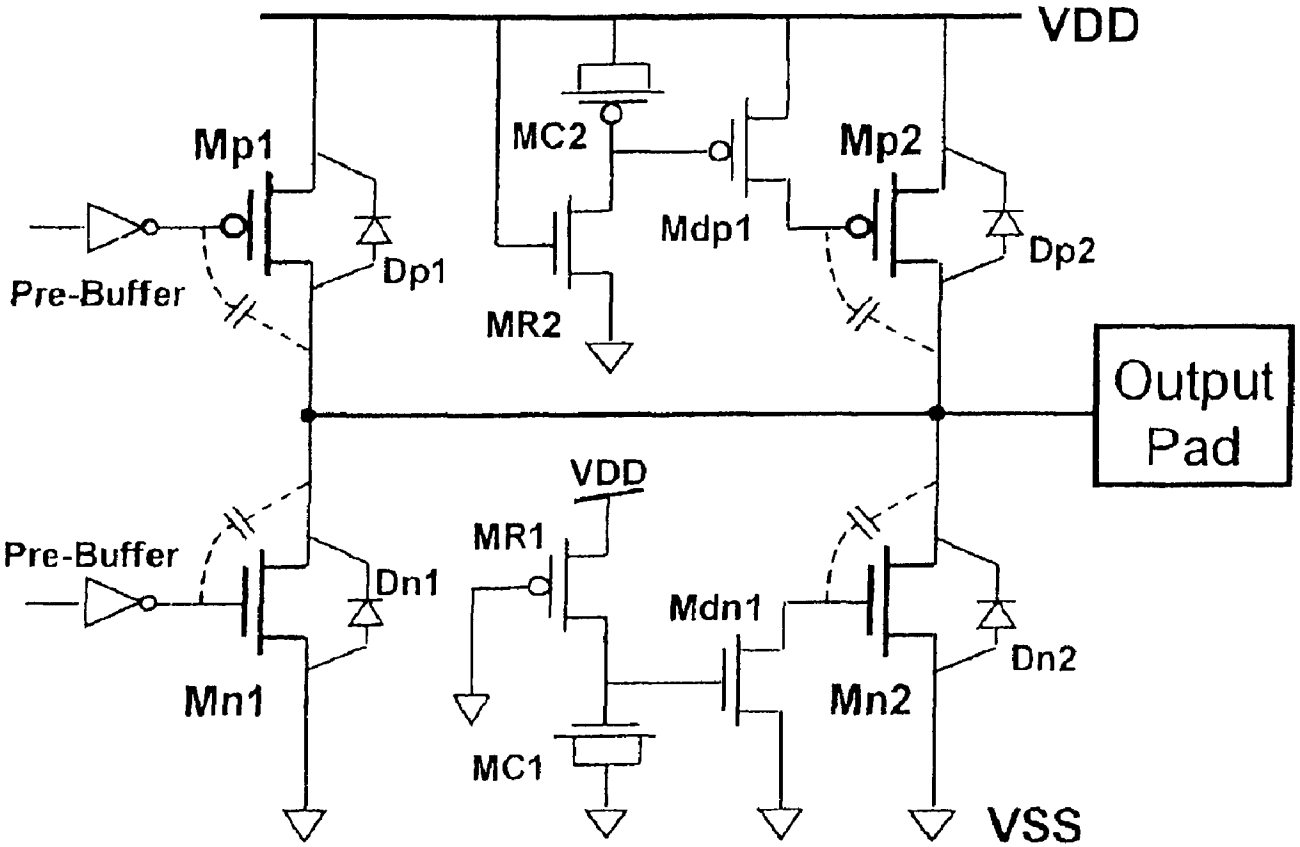
Fig.5 Prior Art
FIG. 5 is a schematic circuit block diagram showing a conventional dynamic-floating-gate circuit technique for improving the ESD robustness of a small-driving output buffer.
Figure 6A:
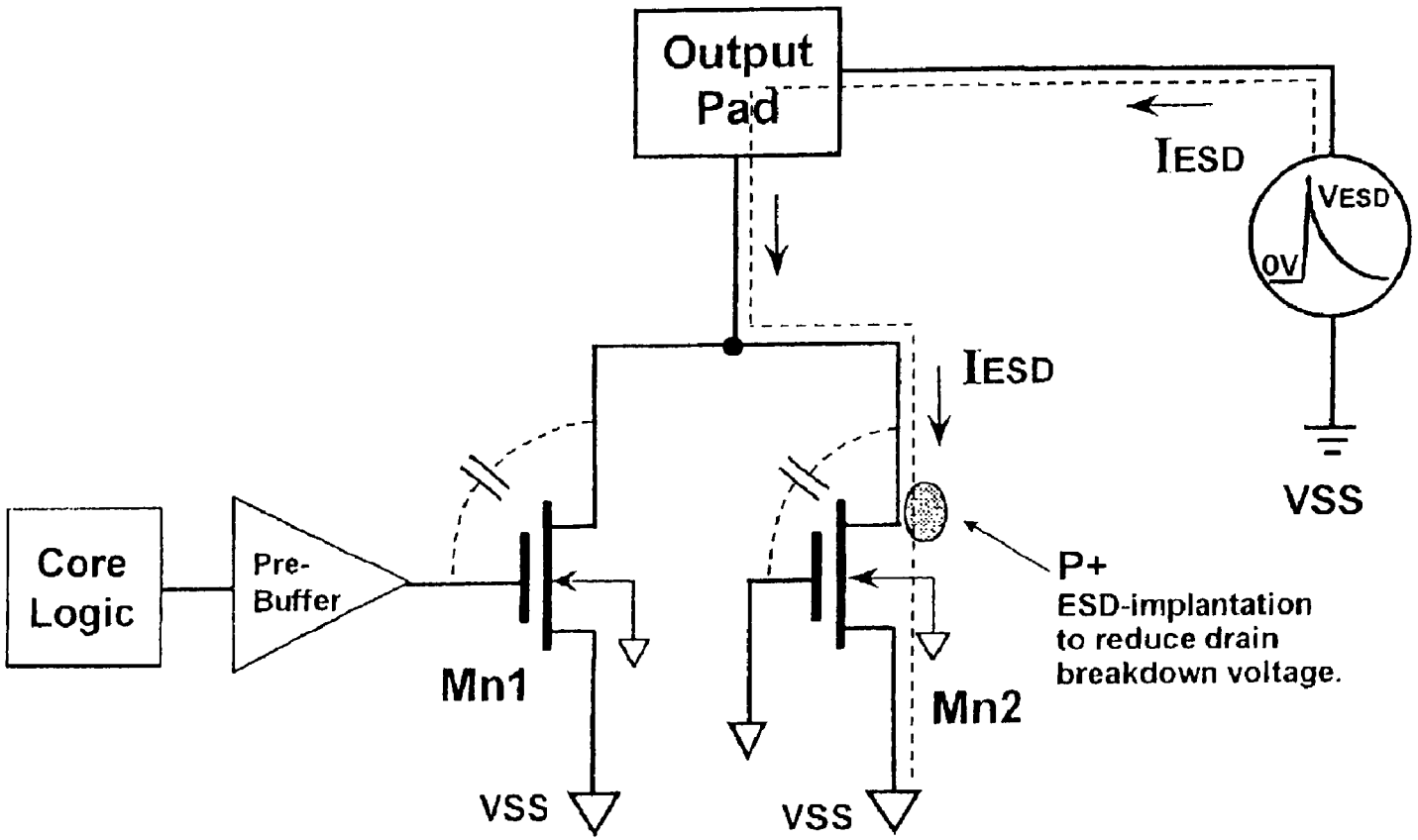
Fig.6(a) Prior Art
FIG. 6(a) is a schematic circuit block diagram showing a conventional ESD-implantation process technique for improving the ESD robustness of a small-driving output buffer.
Figure 6B:
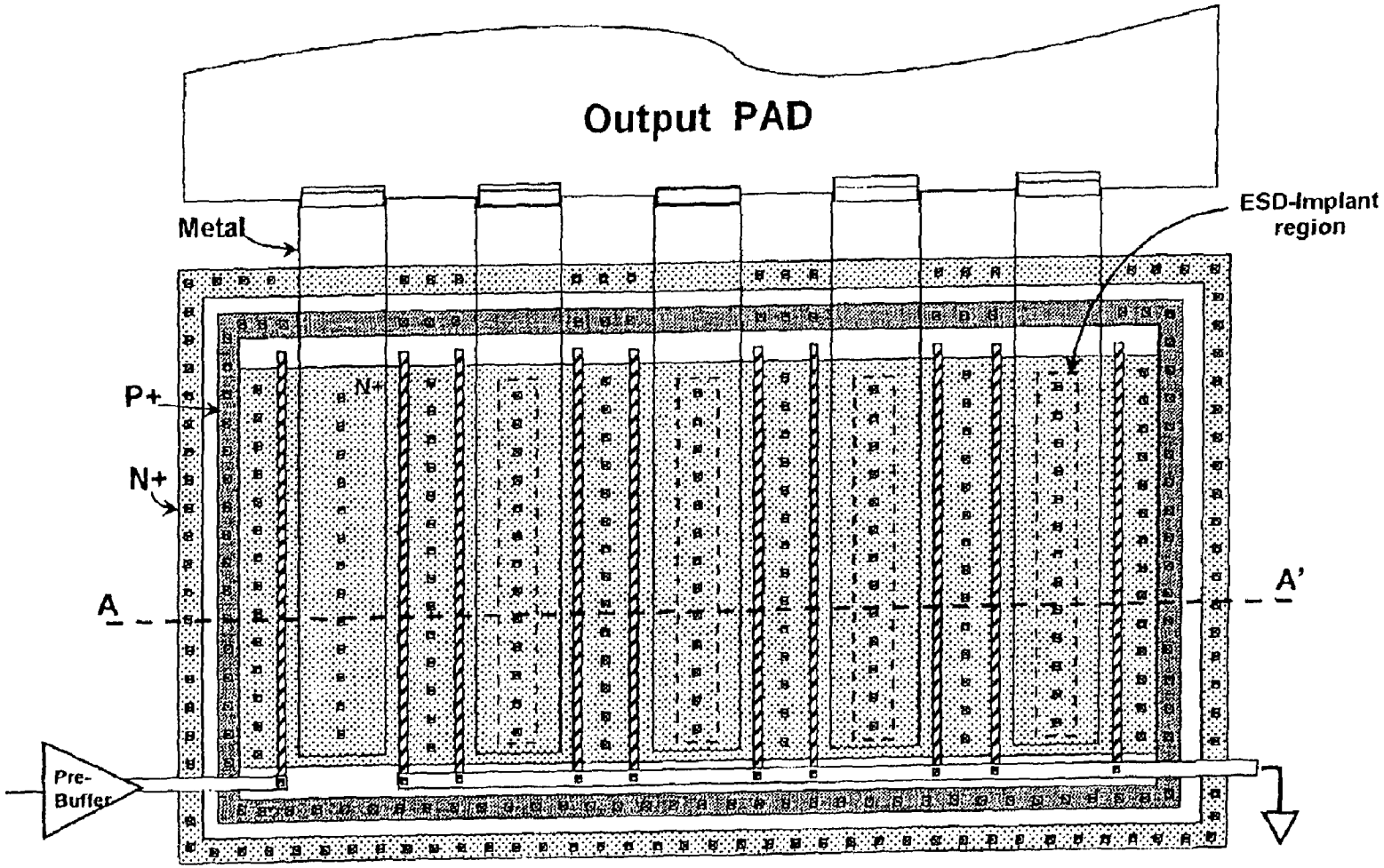
Fig.6(b) Prior Art
FIG. 6(b) is a schematic layout diagram showing the conventional ESD-implantation process technique of FIG. 6(a)
Figure 6C:
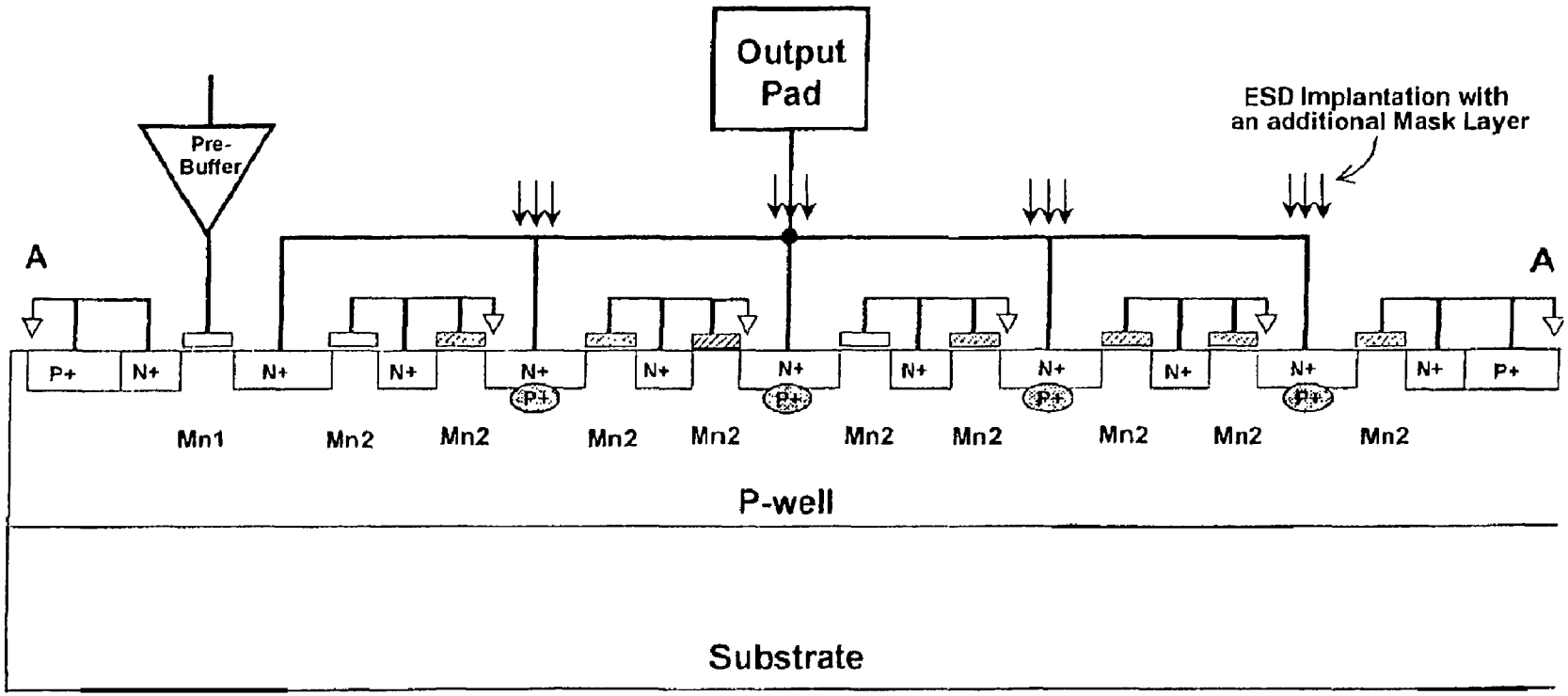
Fig.6(c) Prior Art
FIG. 6(c) is a cross-sectional view schematically showing the conventional ESD-implantation process technique of FIG. 6(a)
Figure 7A:
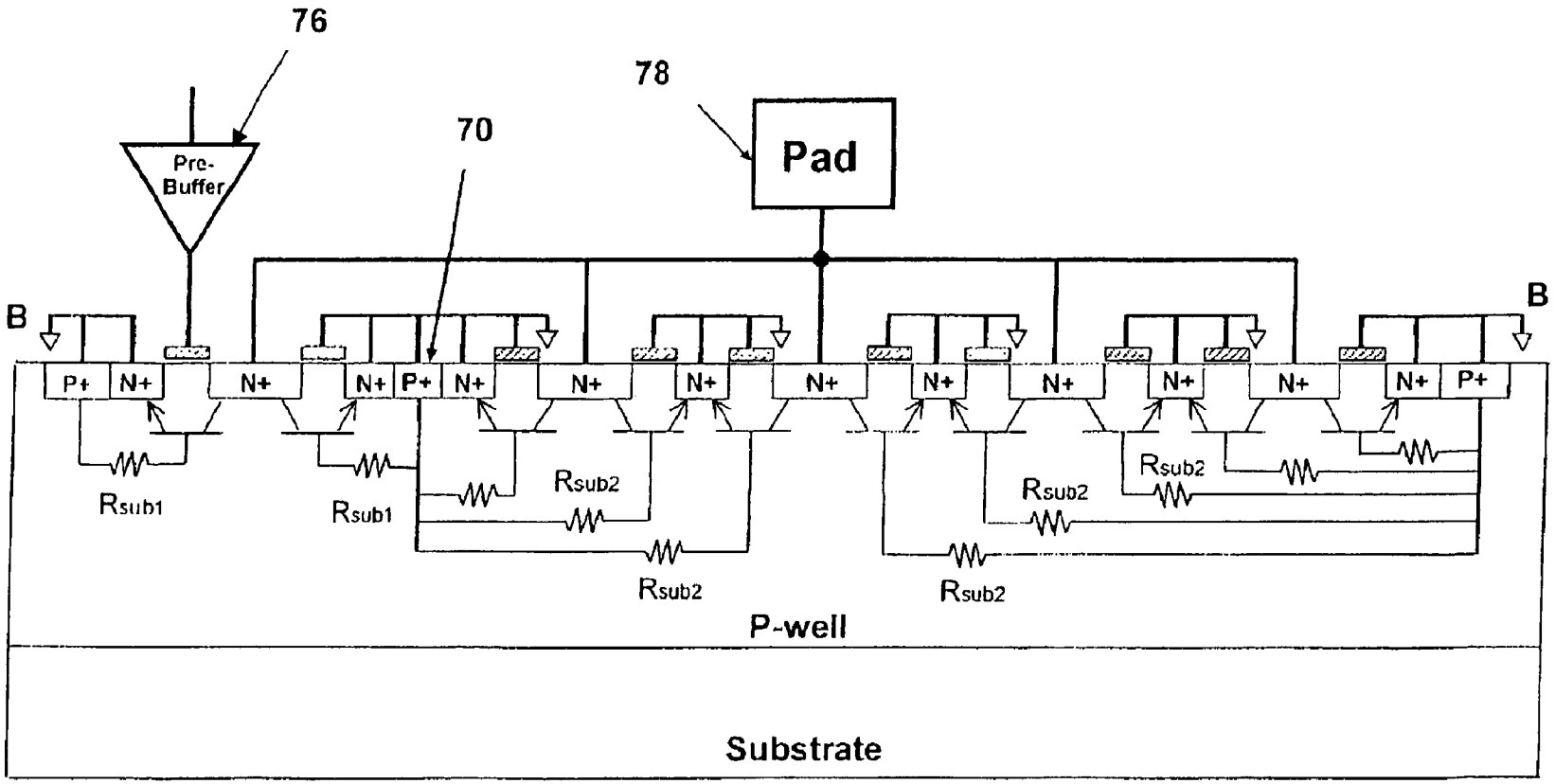
FIG. 7(a) is a cross-sectional view schematically showing a preferred embodiment of a small-driving NMOS device in an output cell with an additional pick-up diffusion region according to the present invention.
Figure 7B:
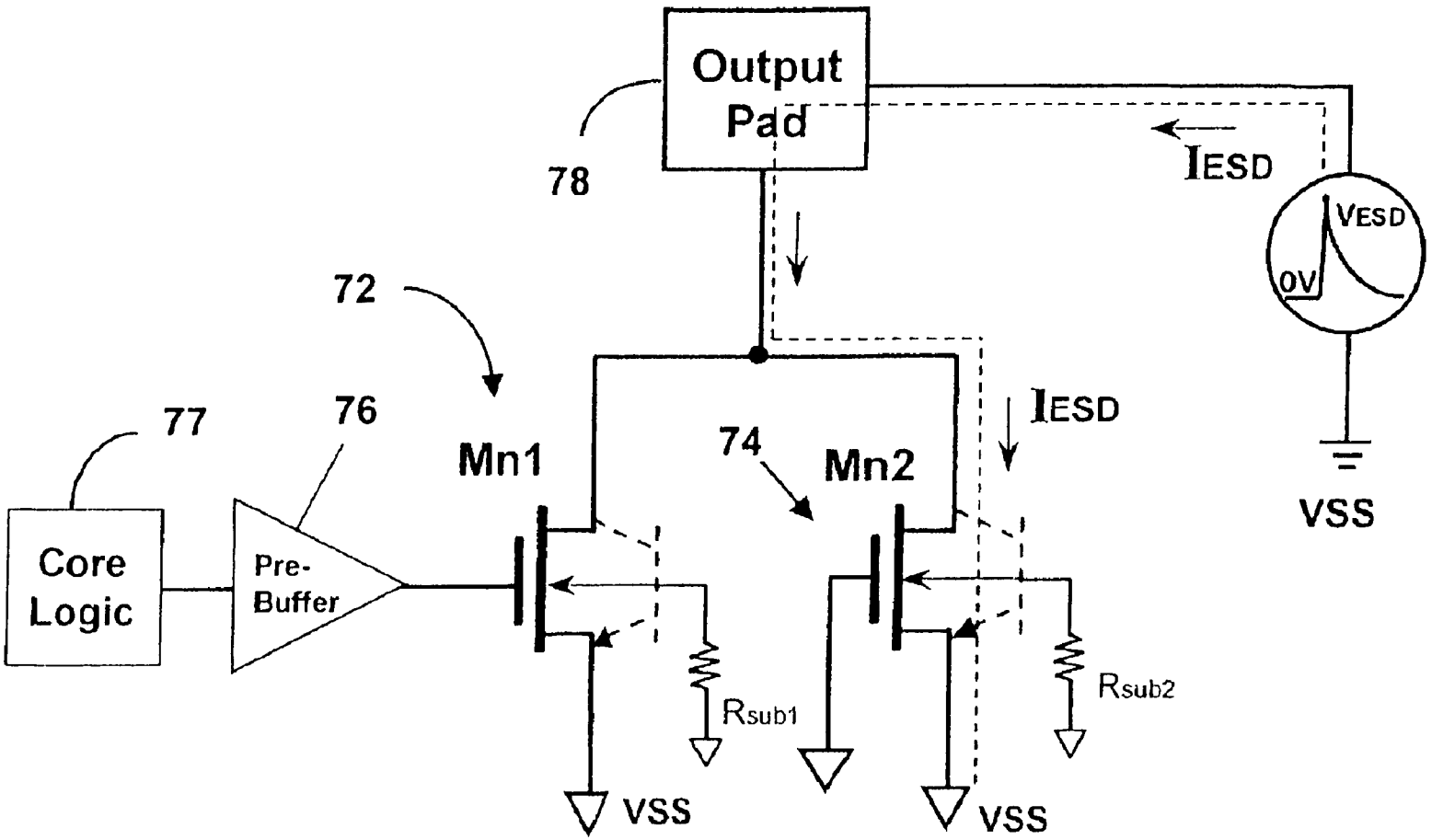
FIG. 7(b) is a schematic circuit block diagram showing the preferred embodiment of FIG. 7(a)

Referring now to FIGS. 7(a) and 7(b), one embodiment of the present invention is shown in which a simple layout is employed for drawing an additional P+ pick-up diffusion region 70, which surrounds one of the MOS transistors (Mn1 guarded device) 72 to reduce its parasitic base-emitter resistance. Therefore, the parasitic BJT in Mn1 has a slower turn-on speed than that of the other MOS transistor (Mn2 ESD protection device) 74. As shown in FIG. 7(b), a pre-buffer 76 with a core logic 77 is connected to the Mn1 device 72, a pad 78 is connected to the Mn1 device 72 and Mn2 device 74, and an ESD current discharging path is indicated by dash lines when the turn-on speed of Mn1 device 72 is slowed down. A corresponding top layout view is shown in FIG. 7(c) in which a cross-sectional view along the dashed line B-B' is cross-referenced in FIG. 7(a).

Figure 7C:
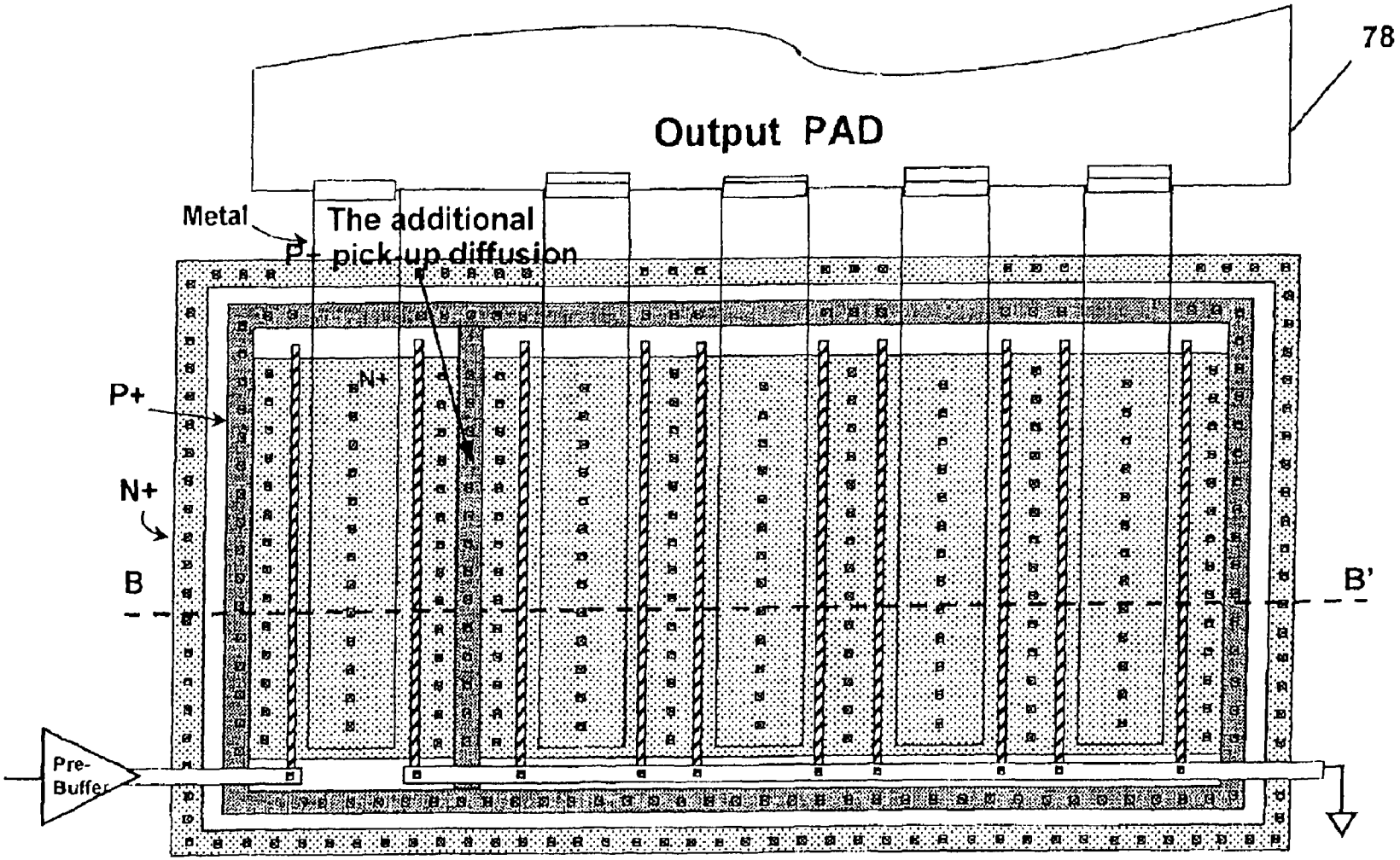
FIG. 7(c) is a schematic layout diagram showing the preferred embodiment of FIG. 7(a)

The operation of the present invention as shown in FIGS. 7(a)-(c) is more fully discussed hereinafter. The drain of Mn1 finger is filly surrounded by the P+ pick-up diffusion 70 (base guard ring). Therefore, the parasitic BJT in the Mn1 device 72 has a smaller equivalent base resistance (Rsub1) in the P-well/P-substrate, because the distance from the base region (under the Mn1 channel region) to the grounded P+ pick-up diffusion 70 is shortest in the layout structure. The drain of Mn2 fingers are drawn without such additional pick-up diffusion region 70, and therefore the parasitic BJT in the Mn2 device 74 has a larger base resistance (Rsub2). When a positive ESD voltage is attached to the output pad as shown in FIG. 7(b), the drains of the Mn1 72 and Mn2 74 devices are broken down by the overstress ESD voltage to generate the breakdown current into the P-well/P-substrate. Because the parasitic BJT in the Mn2 device 74 has a larger base resistance (Rsub2), the Mn2 device 74 is first triggered into the snapback region (the parasitic BJT turn-on region) to clamp the overstress voltage on the output pad 78. Since the Mn2 device 74 in the layout structure has a much larger device dimension, it can sustain a much higher ESD level. On the other hand, the Mn1 device 72 with a smaller device dimension is limited to be turned on during the ESD stress, so that the Mn1 device 72 is not damaged by the ESD energy and the I/O cell has a higher ESD level.

To achieve this effect, the layout structure of the present invention incorporates the additional pick-up diffusion 70 (base guard ring) around the used Mn1 device 72, but not around the unused Mn2 device 74. The triggering on the Mn1 device 72 into a snapback region is restrained or delayed by the additional pick-up diffusion 70, and this allows enough time for the Mn2 device 74 with a relatively larger device dimension to be triggered on to discharge ESD current. If the PMOS has a small Mp1 driving device and a larger unused Mp2 device in the I/O cell layout, the output PMOS device of the present invention can also carried out by means of pulling up device between VDD and the output pad 78.

Figure 8A:
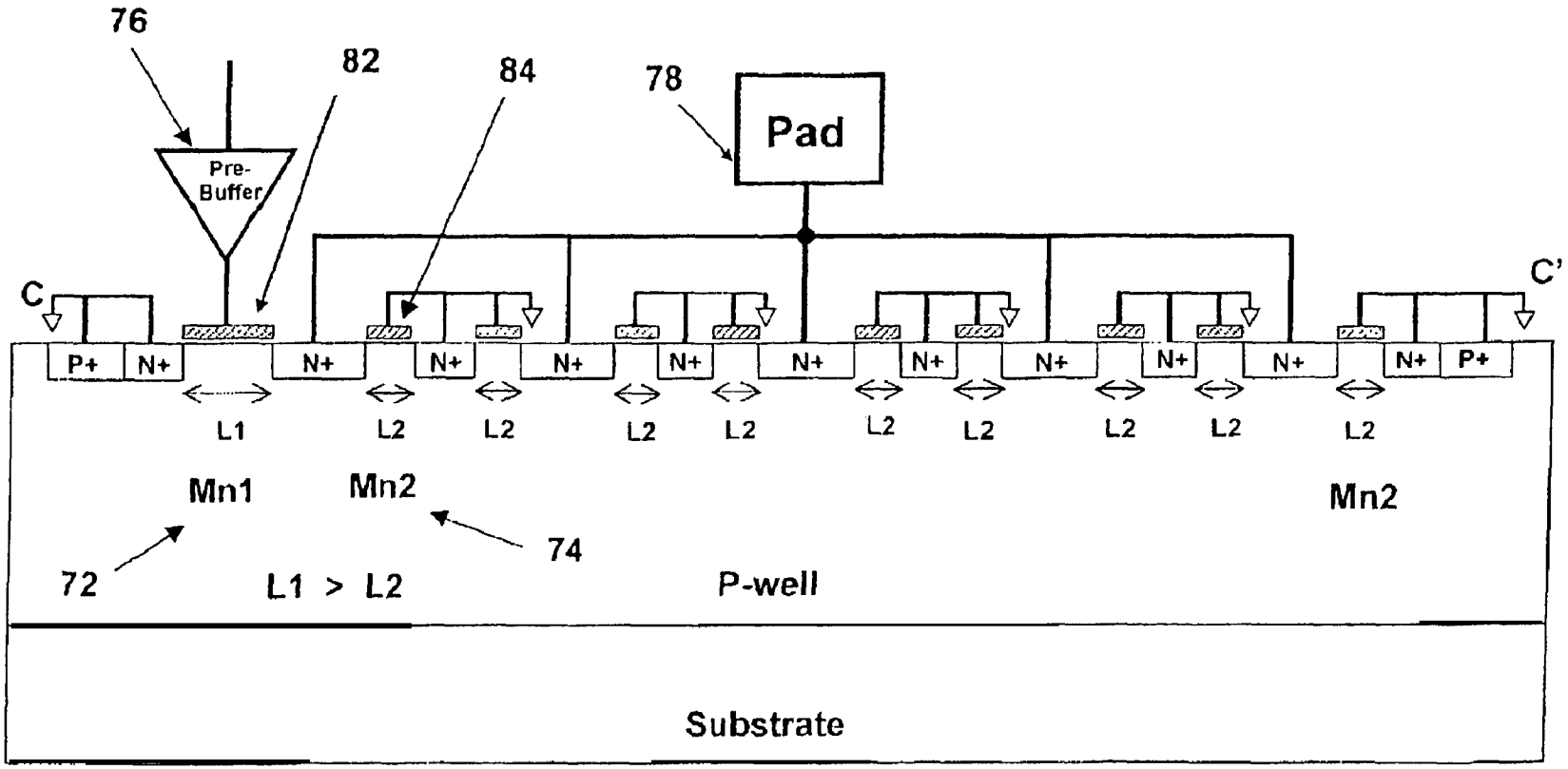
FIG. 8(a) is a cross-sectional view schematically showing a preferred embodiment of a small-driving NMOS device in an output cell with different channel lengths according to the present invention.
Figure 8B:
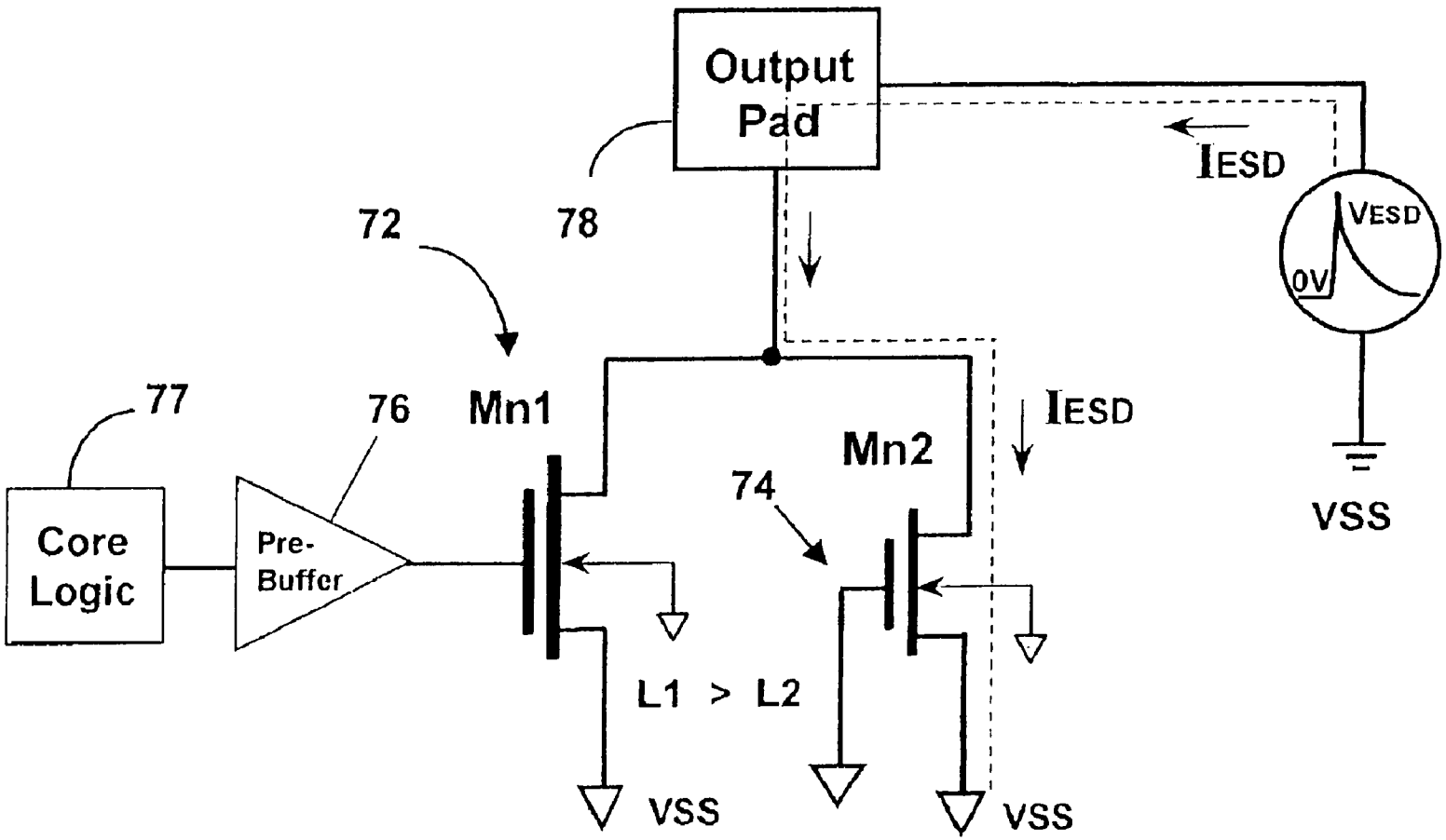
FIG. 8(b) is a schematic circuit block diagram showing the preferred embodiment of FIG. 8(a)
Figure 8C:
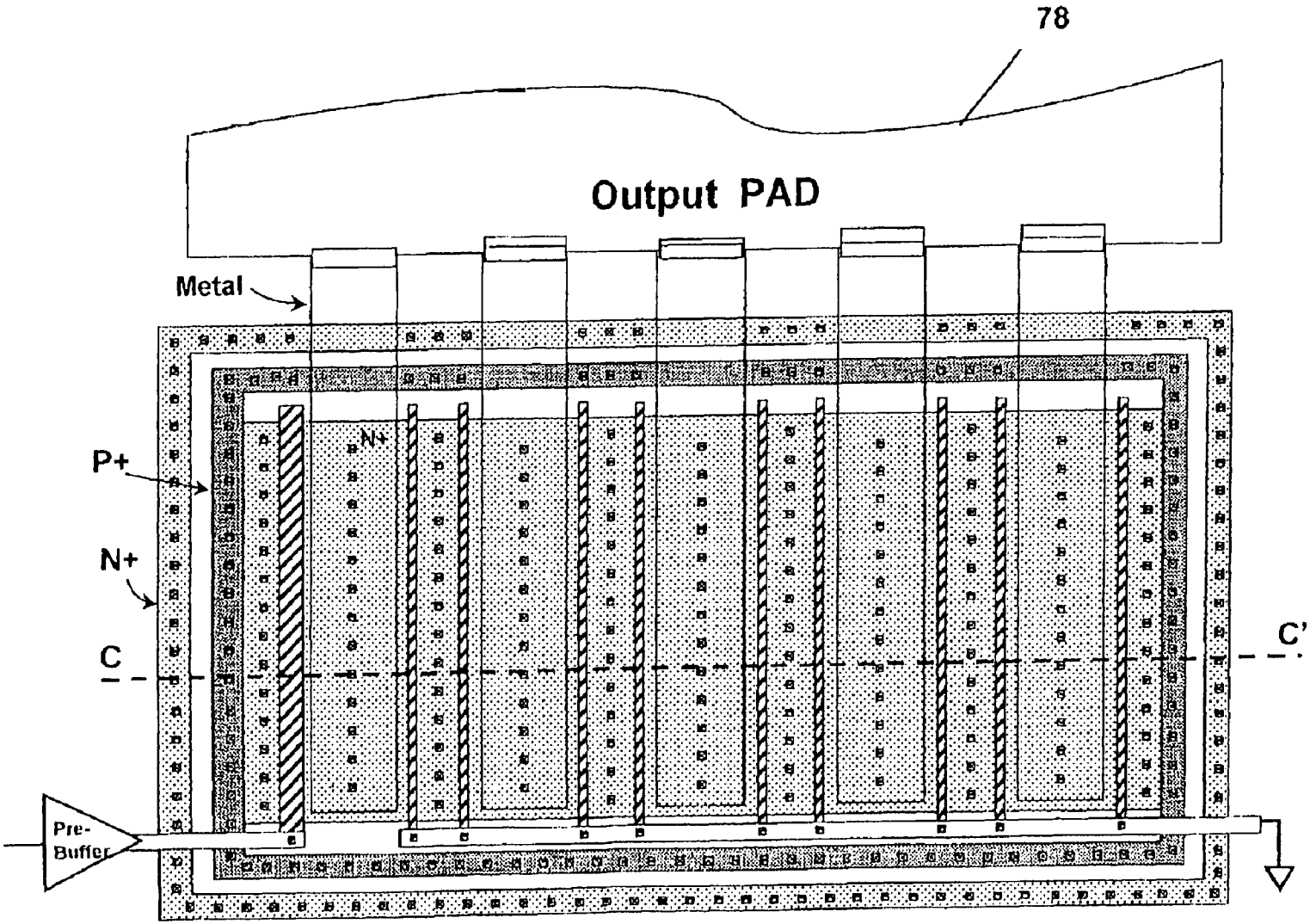
FIG. 8(c) is a schematic layout diagram showing the preferred embodiment of FIG. 8(a)

As shown in FIGS. 8(a)-(c), another way to limit the turn-on speed of the Mn1 device 72 is to change the channel length of Mn1 device 72 and Mn2 device 74 in the I/O cell. For instance, the 0.25-μm CMOS process from Taiwan Semiconductor Manufacturing Company (TSMC) with a fixed channel width of 300 μm and afixed drain-contact-to-polygate spacing (DGS) of 1.5 μm can produce a NMOS device with a channel length (L) of 0.3 μm or 1.0 μm. The breakdown I-V curves of NMOS devices with different channel lengths have been measured in that the NMOS device with 0.3 μm channel length has a breakdown voltage (Vt1) of 9V and a snapback holding voltage (Vh) of 5V, while the NMOS device with 1.0 μm channel length has a breakdown voltage (Vt1) of 9.7V and a snapback holding voltage (Vh) of 6.1V. The NMOS devices with different channel lengths have different breakdown voltages and snapback holding voltages. The dependence of the breakdown voltages and snapback holding voltages on the NMOS channel length are such that an NMOS device with a shorter channel length has a lower breakdown voltage (Vt1) and a lower snapback holding voltage (Vh), which means that it can be turned on faster than the NMOS device having a longer channel length. From this perspective, the Mn1 72 and Mn2 74 devices in the I/O cell layout with different channel lengths can be drawn to restrain the turn-on of the Mn1 device 72. The unused Mn2 device 74 with larger device dimension (channel width) is therefore drawn with a shorter channel length in the layout.

FIG. 8(a) is the device cross-sectional view of the Mn1 72 and Mn2 74 devices with different channel lengths. As shown in FIG. 8(a), the Mn1 device 72 has a longer channel length (L1) 82 relative to the channel length (L2) 84 of the Mn2 device 74. The equivalent circuit is illustrated in FIG. 8(b), and the layout picture is shown in FIG. 8(c). The dashed line C-C' in FIG. 8(c) corresponds to that of FIG. 8(a). The channel length of the Mn1 device 72 is marked as L1 82 and that of the Mn2 device 74 is marked as L2 84. In FIG. 8(a) and FIG. 8(c), the channel length L1 82 is obviously greater than L2 84 in the layout and device cross-sectional view.

As shown in FIG. 8(b), the Mn1 device 72 has a longer channel length (L1) than that of the Mn2 device in the layout. Therefore, the drain breakdown voltage of Mn1 to device 72 is greater than that of the Mn2 device 74 which means that during an ESD stress condition, the Mn2 device 74 with a lower breakdown voltage is triggered on to bypass the ESD current before Mn1 device 72 is turned on.

Additionally, in the semiconductor structure as shown in FIG. 8(a)-(c), the Mn2 device 74 with L2<L1 is triggered to enter its snapback region and discharge ESD current before the Mn1 device 72 is triggered on. As a result, the turn-on speed of the Mn1 device 72 is restrained according to different channel lengths in the layout structure.

Figure 9A:
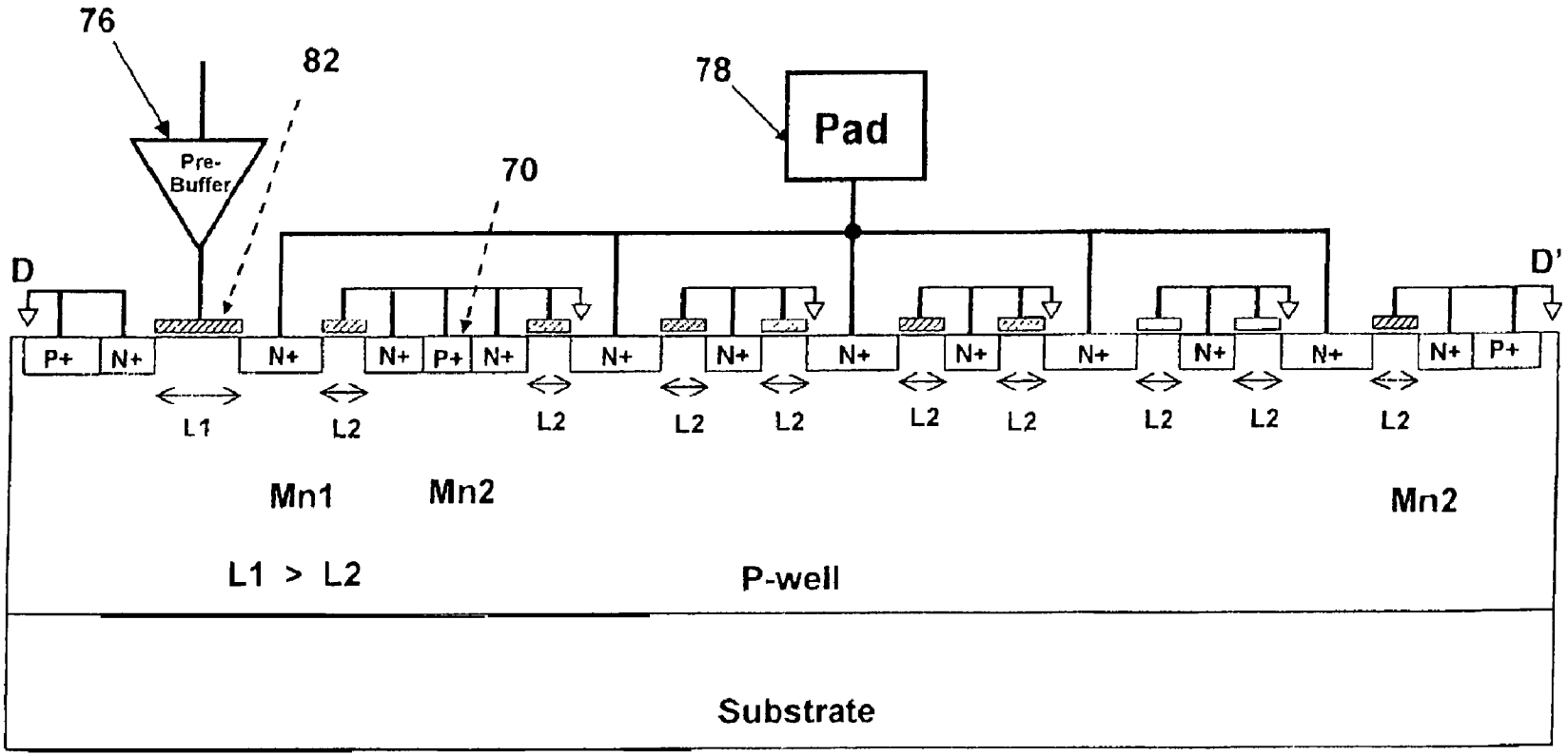
FIG. 9(a) is a cross-sectional view schematically showing a preferred embodiment of a small-driving NMOS device in an output cell with different channel lengths and an additional pick-up diffusion region according to the present invention.
Figure 9B:
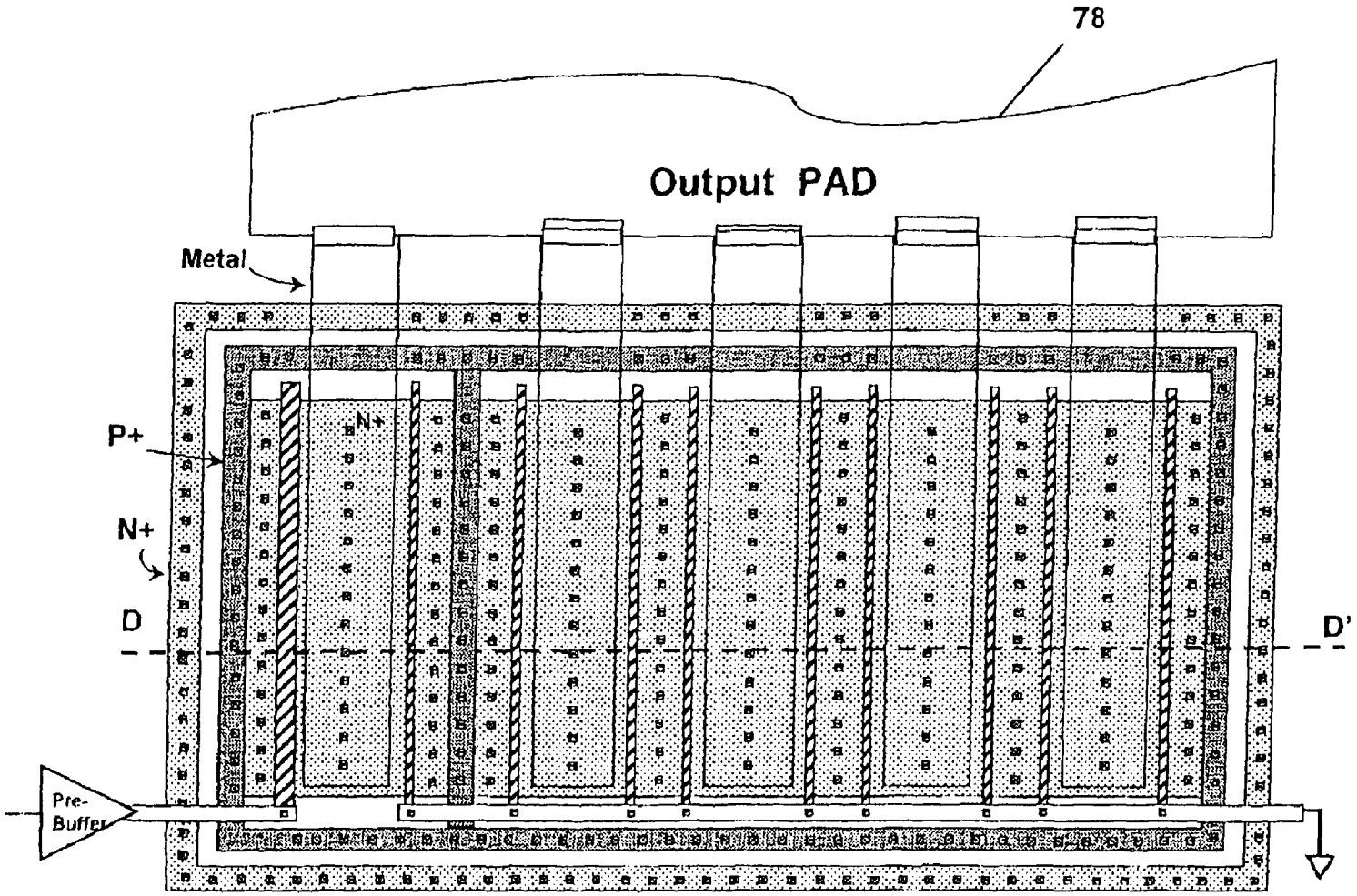
FIG. 9(b) is a schematic layout diagram showing the preferred embodiment of FIG. 9(a)

FIGS. 9(a) and 9(b) show a combination which includes the different channel lengths and the additional pick-up diffusion region to restrain the turn-on speed of the Mn1 device. The PMOS device of I/O cell can be also used by the present invention to restrain the turn-on of Mp1 (with smaller device dimension). The unused Mp2 with a larger device dimension has a relative longer time period to turn on and discharge the ESD current. Therefore, the overall ESD level of the I/O cell with small output current specification can be effectively improved.

One of the preferred embodiments with different channel lengths on the Mn1 device has been used in an in-house 0.5 μm bi-directional I/O cell B001H which has a smaller output current driving ability of only 1 mA. The layout view of NMOS part in the I/O cell of this 1-mA cell is shown in FIG. 8(c). The finger of the Mn1 device used for output current has a channel length of 3.2 μm, but those of the unused device (Mn2) have a channel length of only 0.6 μm. The Mn1 device in FIG. 8(c) has a channel width of 38 μm, but the Mn2 device has a total channel width of 266 μm in the layout. With restrained layout on the Mn1 device, the ESD current is mainly discharged by the Mn2 device with a larger device dimension. This invention is also applied to draw the PMOS layout of the same cell. The Mp1, which provides the output current of 1 mA, has a of channel length of 3.0 μm. By contrast, the Mp2 in the same cell layout has a channel of 0.6 μm (i.e. a difference of 2.4 μm). The channel width of PMOS device Mp1 is 44 μm, and that of PMOS device Mp2 is 396 μm in the B001H cell layout. By restraining to turn on and discharge the ESD current, the overall HBM ESD level of the I/O cell can be effectively improved from 1 kV to greater than 4 kV.

The present invention can be also applied to improve the ESD level of the pure input cell, which has multiple fingers placed in parallel in the layout. The typical input cell used in the I/O cell library is shown in FIG. 10(a), where the layout of NMOS of the pure input cell is drawn in FIG. 10(b). All gates of the parallel fingers in the layout are connected to a ground (VSS I/O) through a resistor Rw2 102 in FIG. 10(a) or directly connected to ground to turn off the NMOS device. Similar layout style is also used to realize the Mp2 104 device in the input cell. This layout style has been generally and widely used in CMOS IC'S.

Figure 10B:
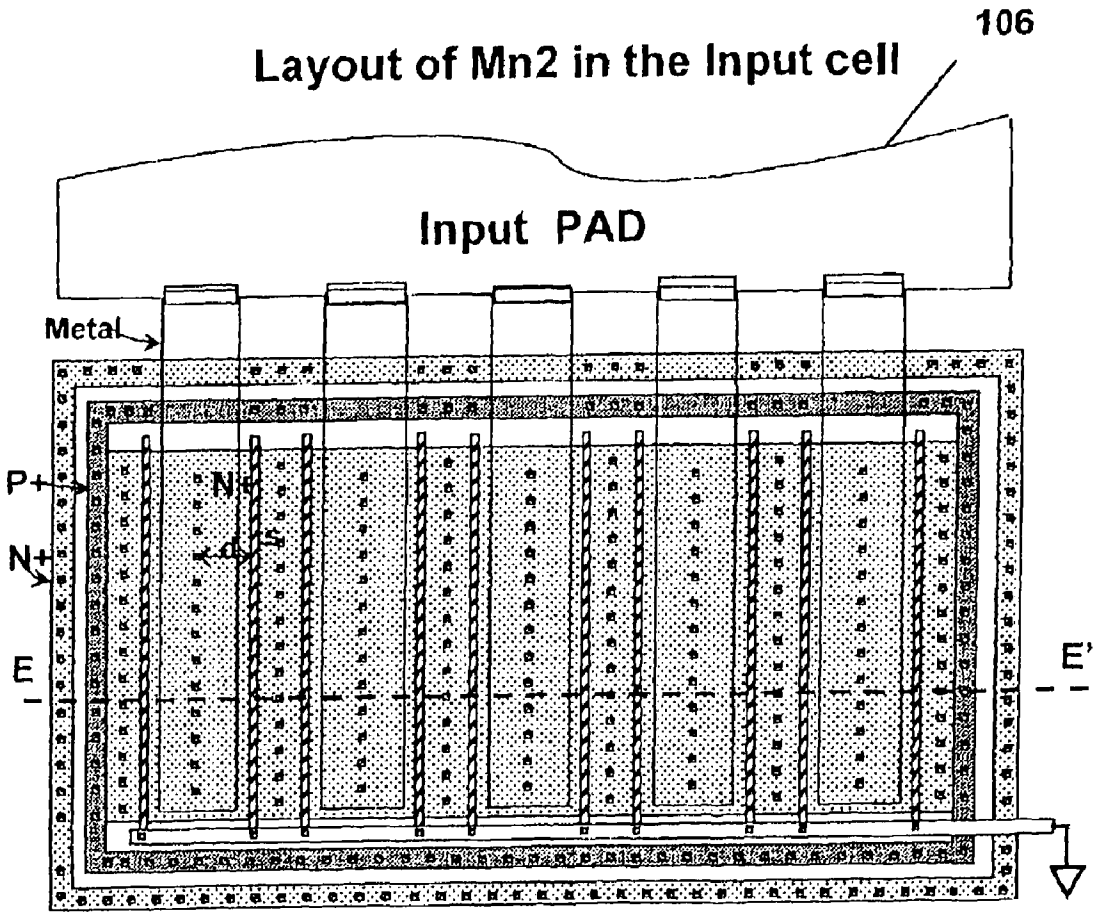
FIG. 10(b) is a schematic layout diagram showing the input ESD protection NMOS circuit of FIG. 10(a)
Figure 10A:
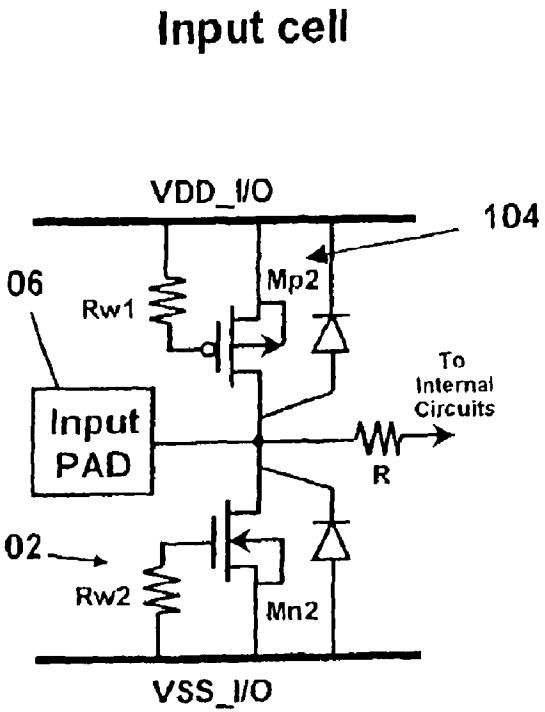
FIG. 10(a) is a conventional schematic circuit block diagram showing an input ESD protection NMOS circuit.

Although the fingers in the NMOS layout of FIG. 10(b) is very symmetrical, the fingers are still hard to be uniformly turned on by the ESD current under ESD stress. The photo-emission microscope (EMMI) picture of the NMOS in the input cell shows that during the ESD stress condiction, only several fingers located at the center of the NMOS layout are turned on to discharge the ESD current. Therefore, the NMOS has a lower ESD level even if the total channel width in the layout is large enough. Only few fingers at the layout center region are triggered into the snapback region, which has a lower holding voltage of 5V than the breakdown voltage of 9V. The most others can be triggered on when the pad voltage is greater than the drain breakdown voltage (9V). A few of turned-on fingers clamp the voltage level on the pad to the holding voltage of 5V to limits the other fingers to be continually triggered on by the ESD voltage. The channel region of the center fingers in the layout of FIG. 10(b) has a far spacing to the pick-up diffusion. Therefore, the parasitic BJT of the center fingers has a larger base resistance (Rsub). With a larger base resistance, the parasitic BJT of the center fingers is turned on faster than that of fingers which close to the two sides, which causes a non-uniform turn-on behavior. When only few center fingers are triggered on to discharge ESD current, the input cell often has a low ESD level even if it has a total large enough device dimension on the NMOS layout.

Figure 11A:
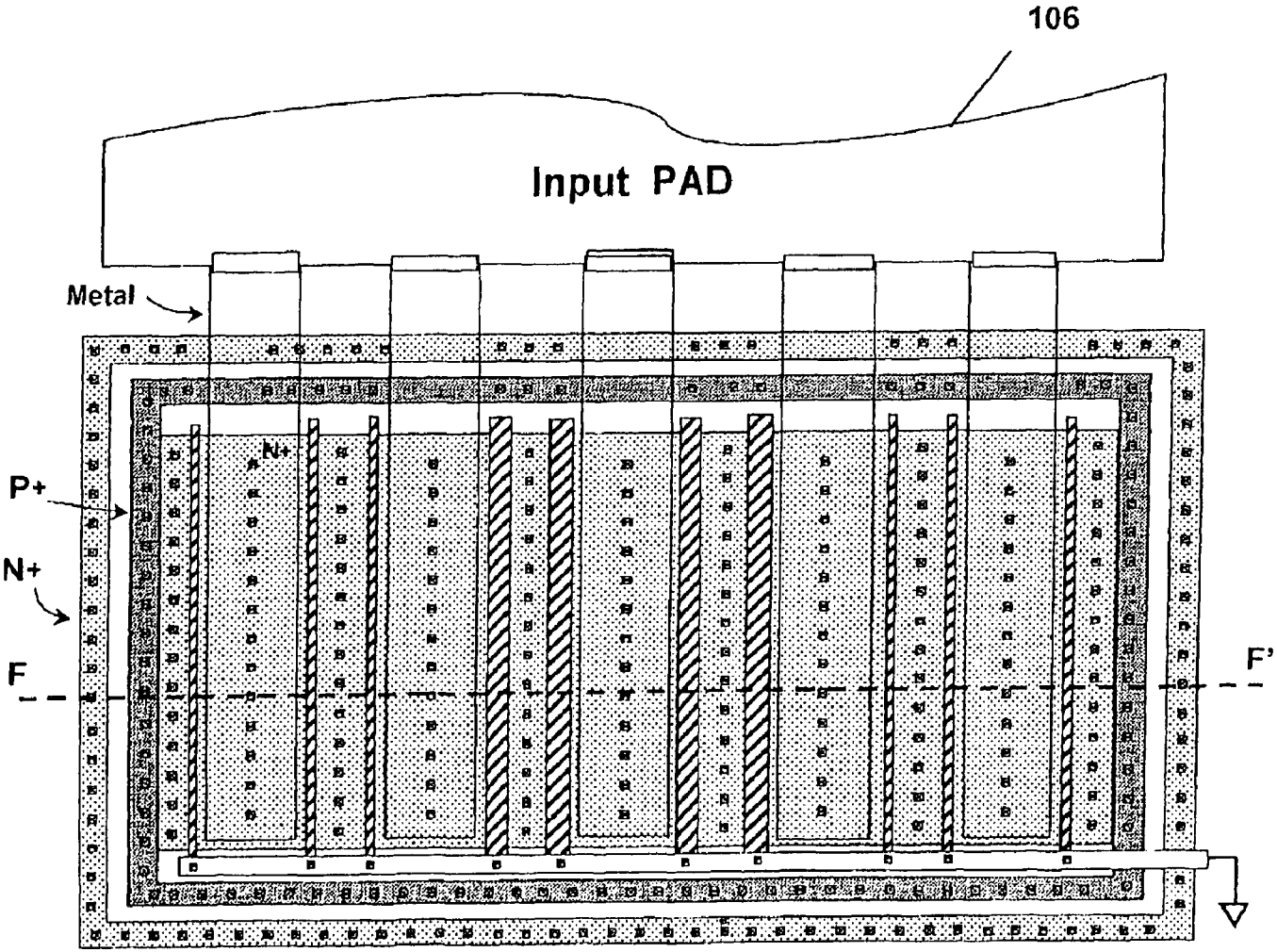
FIG. 11(a) is a schematic layout diagram showing the preferred embodiment of the input ESD protection NMOS circuit with different channel lengths according to the present invention.
Figure 11B:
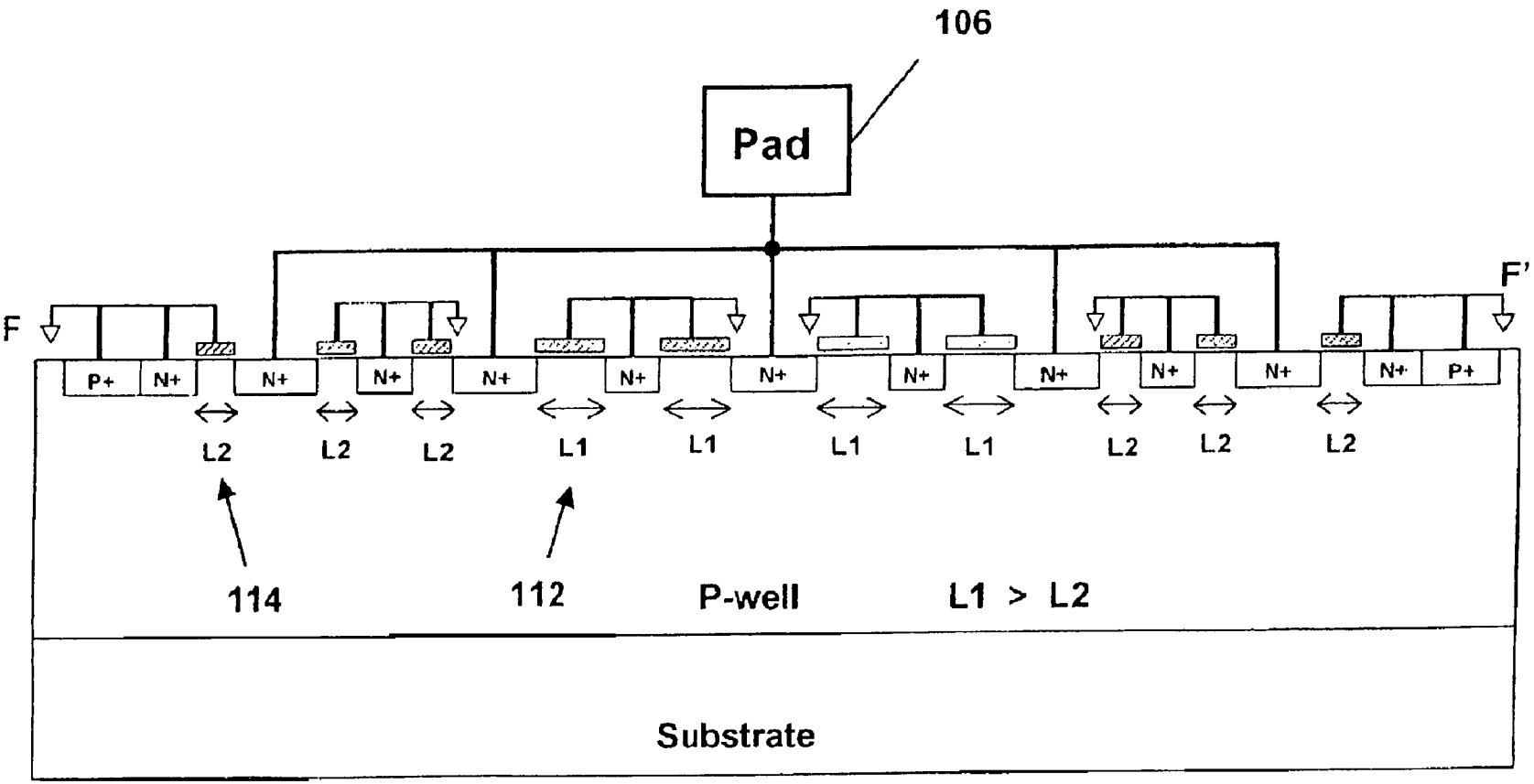
FIG. 11(b) is a cross-sectional view schematically showing the preferred embodiment of FIG. 11(a)

The non-uniform turn-on behavior in FIG. 10(a) can be overcome with turn-on restrained layout on the center fingers of the input cell. The layout structure with different channel lengths on the input NMOS is shown in FIG. 11(a). The corresponding device structure along the dashed line F-F' in FIG. 11(a) is shown in FIG. 11(b). In FIGS. 11(a) and (b), the channel length L1 112 of the center fingers are wider than the channel length L2 114 of the edge fingers. By suitably adjusting the channel length in layout to compensate the difference on the turn-on speed of the center fingers, the multiple fingers of the input NMOS can be uniformly triggered on. Therefore, the input cell has a much higher ESD level, and the fingers in the layout are all turned on to discharge ESD current. Of course, the present invention can be also applied to the input PMOS (Mp2 in FIG. 10(a)), which is often drawn in the same layout style.

Figure 12A:
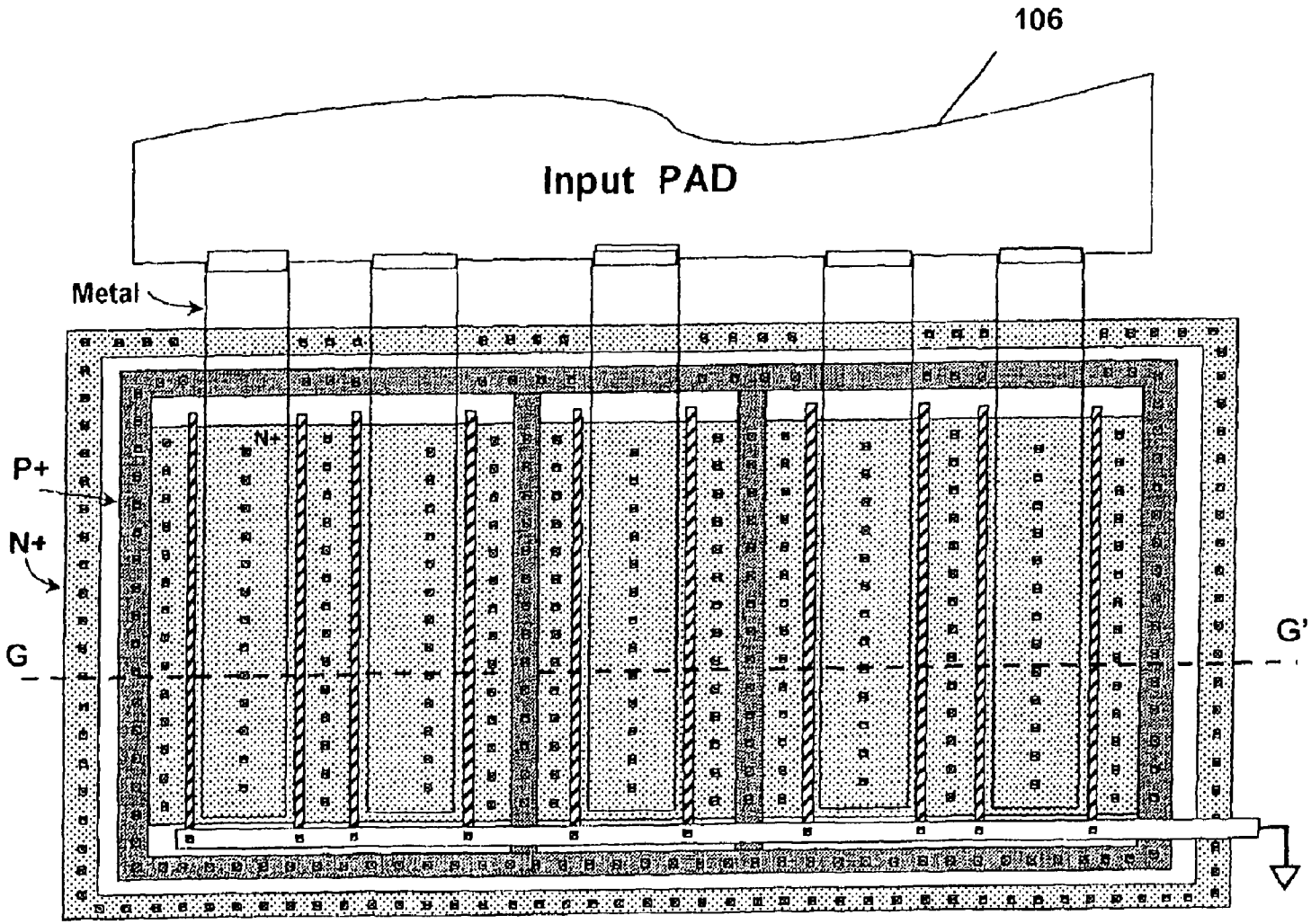
FIG. 12(a) is a schematic layout diagram showing the preferred embodiment of the input ESD protection NMOS circuit with additional pick-up diffusion regions according to the present invention.
Figure 12B:
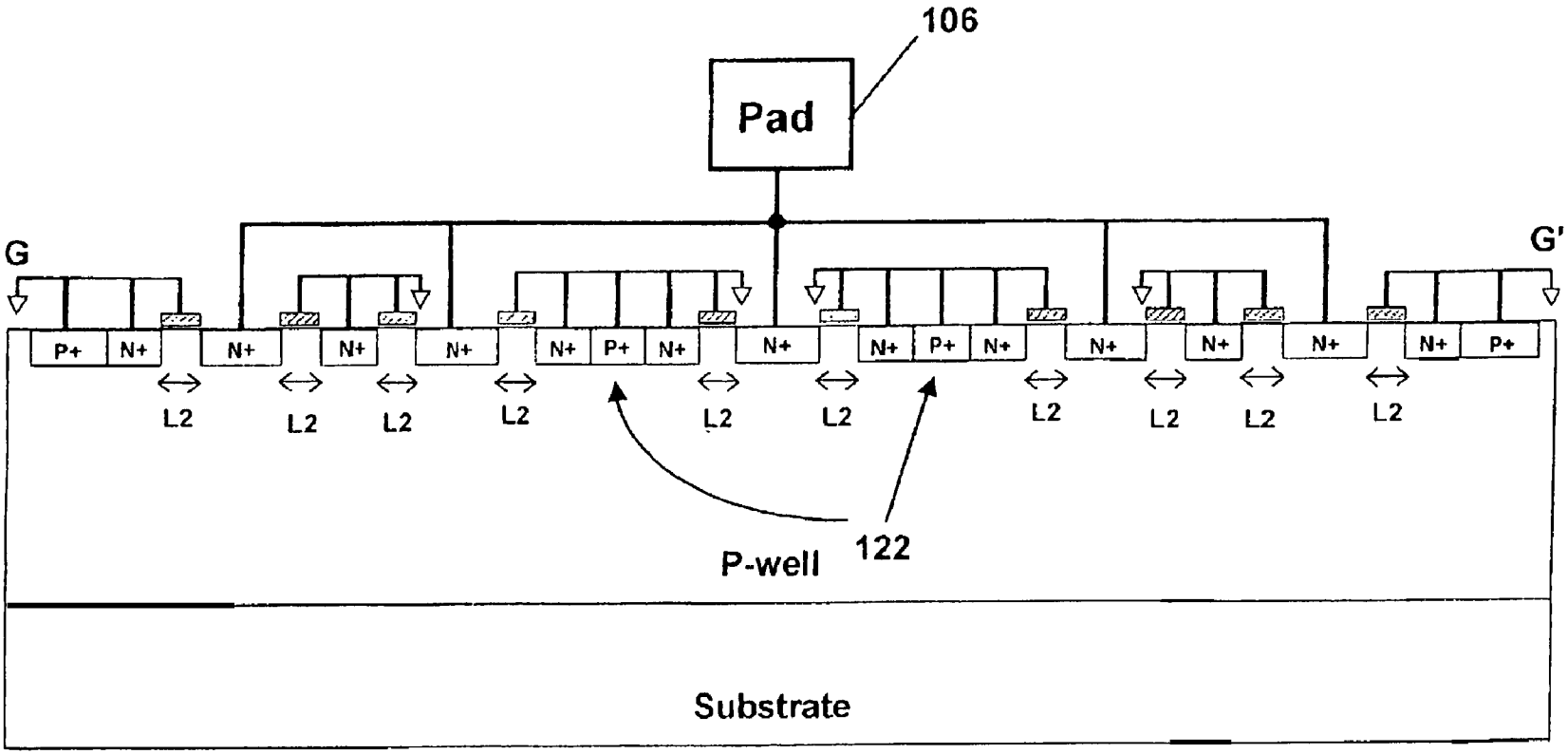
FIG. 12(b) is a cross-sectional view schematically showing the preferred embodiment of FIG. 12(a)

To compensate for the base resistance effect, the additional pick-up diffusion regions 122 in FIG. 12(b) are also used to surround the center fingers in the NMOS layout of the input cell, as that shown in FIGS. 12(a) and (b). The device cross-sectional view along the dashed line G-G's in FIG. 12(a) is shown in FIG. 12(b). With the additional pick-up diffusion region 122, the center fingers have a lower base resistance. Therefore the parasitic BJT of the center fingers have a slower turn-on speed than before. By using the restrained turn-on method on the center fingers of the NMOS (or PMOS) layout, the turn-on uniformity among the multiple fingers of input cell can be effectively improved to sustain a higher ESD level.

Figure 13:
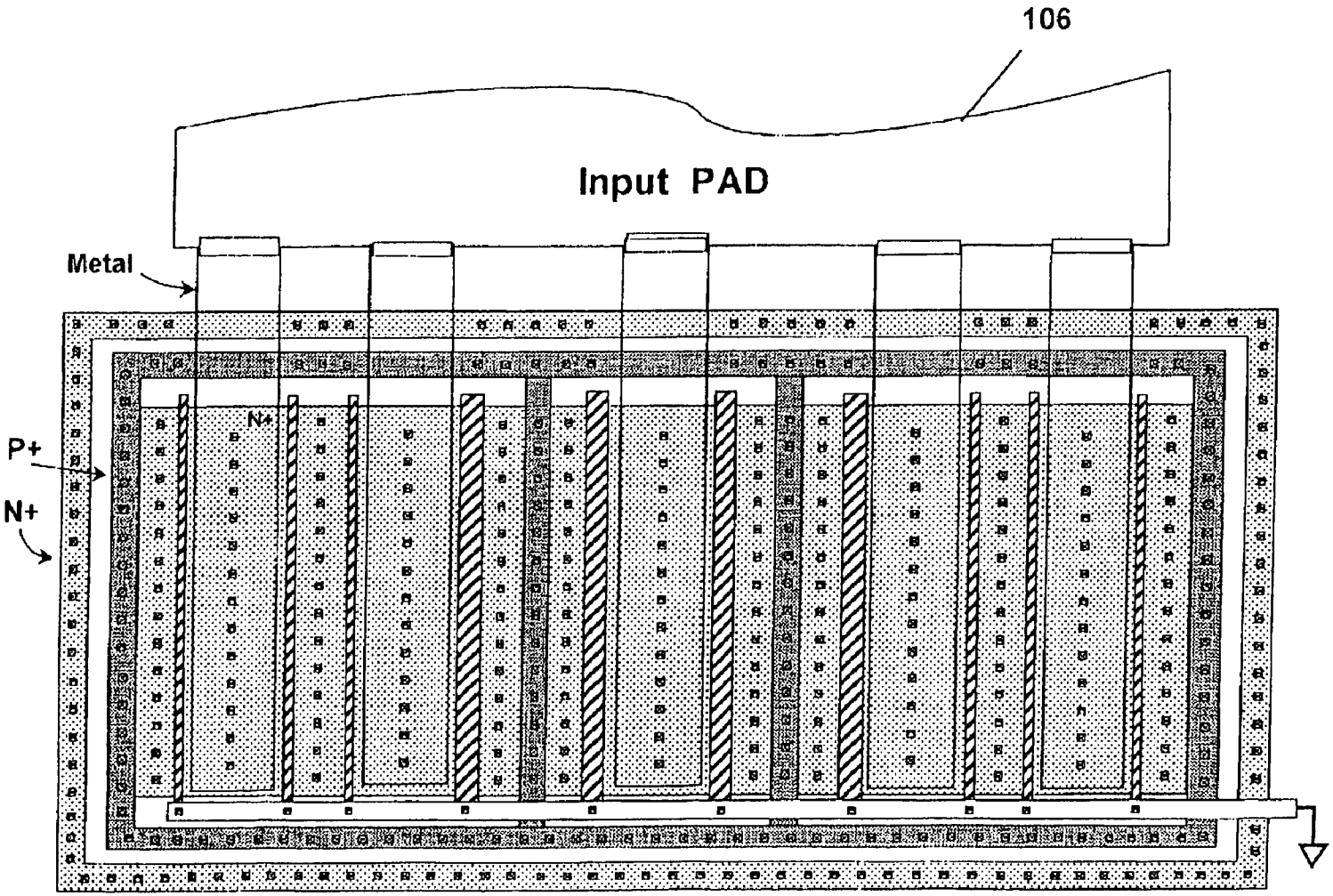
FIG. 13 is a schematic layout diagram showing the preferred embodiment of the input ESD protection NMOS circuit with different channel lengths and additional pick-up diffusion regions according to the present invention.

In FIG. 13, the center fingers are drawn with both the wider channel length and the additional pick-up diffusion region. By suitably adjusting these two new inventions, this can better restrain the center finger turn-on speed to achieve an overall better ESD performance.

Figure 14A:
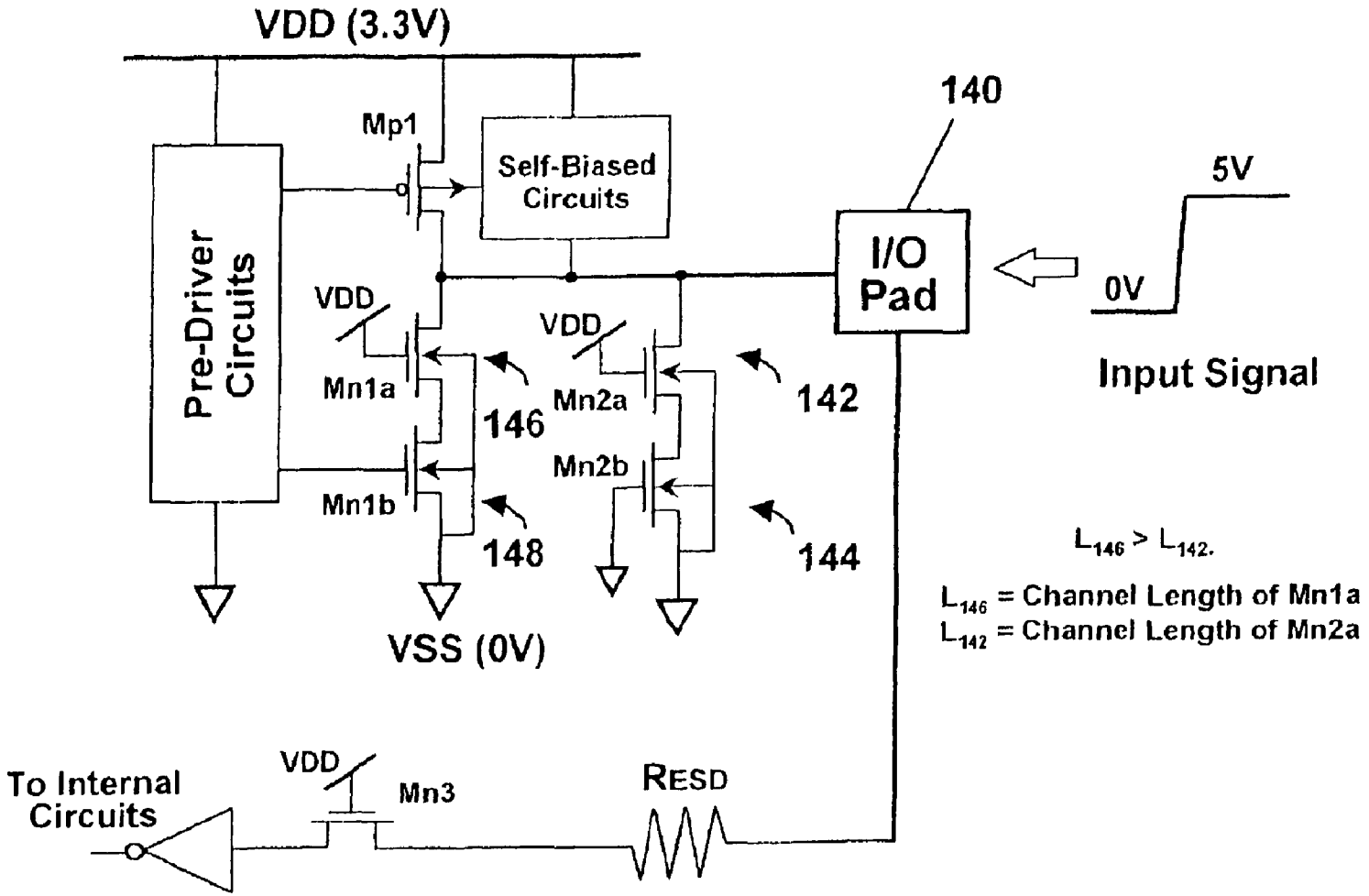
FIG. 14(a) is a schematic circuit block diagram showing a preferred embodiment of a 3V/5V-tolerant I/O cell with different channel lengths according to the present invention.
Figure 14B:
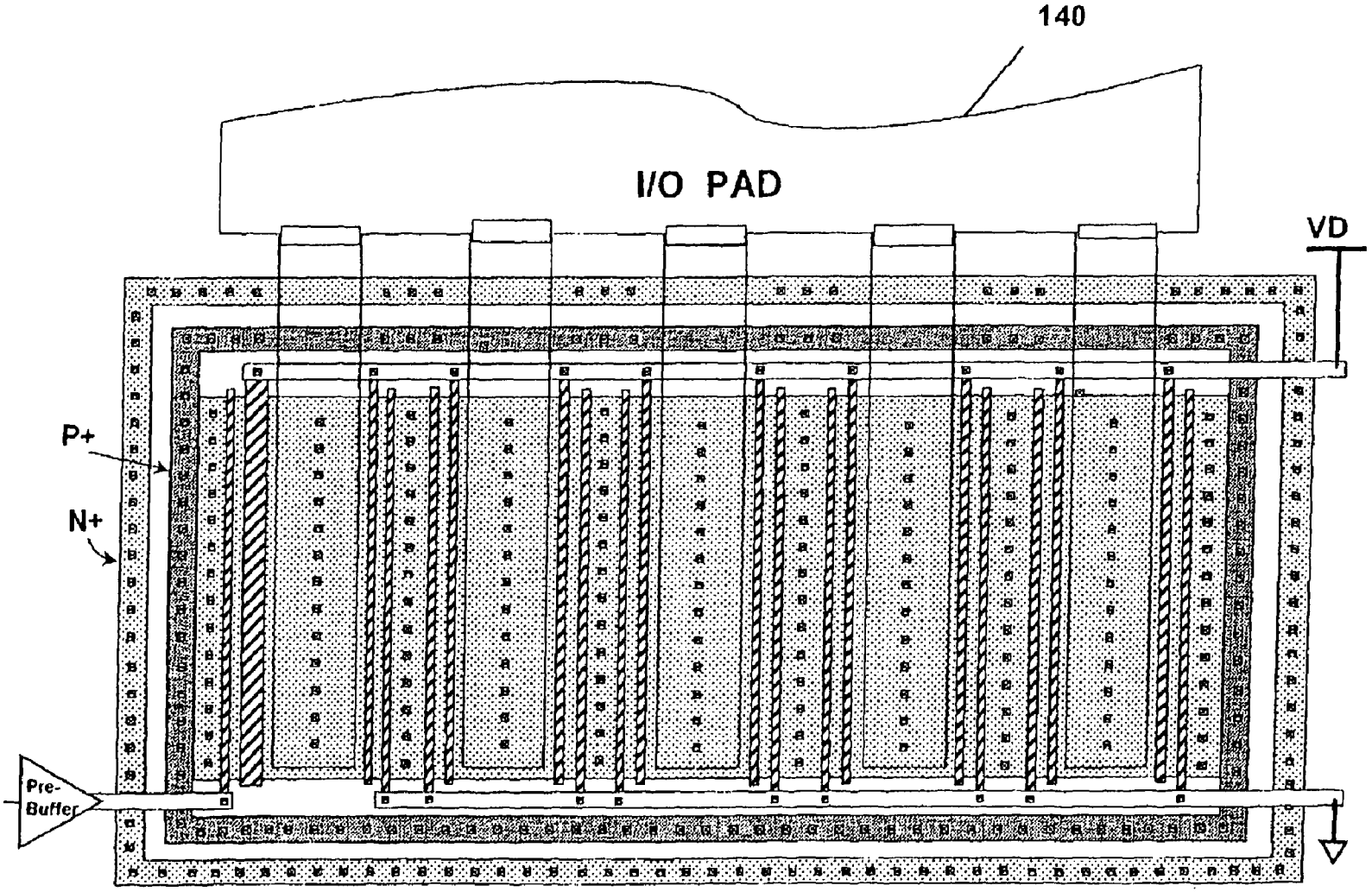
FIG. 14(b) is a cross-sectional layout view schematically showing the preferred embodiment of FIG. 14(a).

When the CMOS technology scaled down to sub-half-micron regime, the voltage level of VDD in the chip is also reduced to a lower voltage level, such as 3.3V, 2.5V, or 1.8V for core circuits. However, the I/O signal come from external circuits of chips in a system may have different voltage levels, which may be greater than VDD of the chip. Therefore, the high-voltage-tolerant I/O circuits are designed and used in such an interface condition. A typical 3V/5V-tolerant I/O circuit is shown in FIG. 14(a), where the NMOS from the pad 140 to VSS often has stacked device configuration. Such high-voltage-tolerant I/O cells in a cell library also have different output current specifications, so the stacked NMOS (Mn1a and Mn1b) devices may have a smaller device dimension for the cell with smaller output current driving ability. In the cell layout, the unused fingers of stacked NMOS (Mn2a and Mn2b devices in FIG. 14(a)) in the I/O cell with small output current are turned off in function but also work as the ESD protection device. To avoid the gate coupling effect that causes a low ESD level on such a 3V/5V-tolerant I/O cell, the turn-on restrained method can be also applied on the Mn1a 146 and Mn1b 148 NMOS layout as that shown in FIG. 14(b). The polygate (channel length) of the Mn1a 146 device is drawn with a wider width to restrain the turn-on of stacked Mn1a 146 and Mn1b 148 devices in the layout. Therefore, the Mn2a 142 and Mn2b 144 devices with smaller channel length can be turned on to discharge the ESD current. Because the stacked Mn2a 142 and Mn2b 144 devices have a larger device dimension (channel width), they can sustain a higher ESD level by further restraining the turn-on speed of the stacked Mn1a 146 and Mn1b 148 devices. The additional pick-up diffusion can be also used to surround these stacked Mn1a. If such 3V/5V-tolerant I/O cell is only used as input, where the gate of the Mn1a and Mn1b devices are all connected to ground, the center fingers of the stacked NMOS layout can be drawn with a wider channel length or surrounded by the additional pick-up diffusion to restrain the turn-on speed of the center fingers. Then, the overall ESD level of such a 3V/5V-tolerant input cell can be effectively improved due to the uniform turn-on behavior among the multiple fingers in parallel in the I/O cell layout.

Although a specific form of the present invention has been described above and illustrated in the accompanying drawings in order to be more clearly understood, the above description is made by way of example and not as a limitation to the scope of the present invention. It is believed that various modifications apparent to one of ordinary skill in the art could be made without departing from the scope of the present invention which is to be determined by the following claims.

What is claimed is:

1. A semiconductor structure for electrostatic discharge (ESD) protection of a metal oxide semiconductor (MOS) integrated circuit, *said semiconductor structure* comprising:

a substrate of a first conductivity type [forming] *that forms* a base for said semiconductor structure;

a first region of a second conductivity type within said substrate [for forming] *that forms* a drain of a first MOS transistor;

a second region of the second conductivity type within said substrate [for forming] *that forms* a source of the first MOS transistor;

a third region of the second conductivity type within said substrate [for forming] *that forms* a source of a second MOS transistor, [wherein] *and* a [fourth] *pick up diffusion* region of the first conductivity type [is disposed between the second region of said first MOS transistor and the third region of said second MOS transistor for] *between the second region of said first MOS transistor and the third region of said second MOS transistor, wherein the pick up diffusion region* [surrounding] *surrounds* said first MOS transistor [with an additional] *laterally, wherein said second MOS transistor is not included within the* pick up diffusion *region, wherein the pick up diffusion region is configured* to restrain [the] *a* turn on of said first MOS transistor; and wherein [the] *a* channel length of said first MOS transistor is longer than [the] *a* channel length of said second MOS transistor to increase [the] *a* drain base voltage of said first MOS transistor.

2. A semiconductor structure for electrostatic discharge (ESD) protection of a metal oxide semiconductor (MOS) integrated circuit, *said semiconductor structure* comprising:

a substrate of a first conductivity type [forming] *that forms* a base for said semiconductor structure;

a first region of a second conductivity type with said substrate [for forming] *that forms* a drain of a first MOS transistor;

a second region of [he] the second conductivity type within said substrate [for forming] *that forms* a source of the first MOS transistor;

a third region of the second conductivity type within said substrate [for forming] *that forms* a source of a second MOS transistor, [wherein]

[a fourth] *a first pick up diffusion* region of the first conductivity type [is disposed between the second region of]

*disposed between the second region of the first MOS transistor and the third region of the second MOS transistor, wherein the first pick up diffusion region surrounds* said first MOS transistor [and the third region of said second MOS transistor for surrounding said first MOS transistor with an additional pick up diffusion to restrain the] *laterally, wherein the first pick up diffusion region does not surround said second MOS transistor, wherein the first pick up diffusion region is configured to restrain a* turn on of said first MOS transistor[;], a first channel region disposed between said first and second regions of said first MOS transistor; and a second channel region disposed adjacent to said third region of said second MOS transistor, wherein [said] *a* first channel length of said first channel region is longer than [the] *a* channel length of said second channel region to increase [the] *a* drain base breakdown voltage of said first MOS transistor.

3. A semiconductor structure for electrostatic discharge (ESD) protection of a metal oxide semiconductor (MOS) integrated circuit, *said semiconductor substrate* comprising:

a substrate of a first conductivity type *that* [forming] *forms* a base for said semiconductor structure;

a pair of first regions of a second conductivity type within said substrate [for defining] *that define* a first channel region of the second conductivity type for a first MOS transistor;

a pair of second regions of the second conductivity type within said substrate [for defining ] *that defines* a second channel region of the second conductivity type for a second MOS transistor, wherein [the] *a* channel length of said first channel region is greater than [the] *a* channel length of said second channel region to reduce a turn on speed of said first MOS transistor; and

*a pick up diffusion region of the first conductivity type that surrounds said first MOS transistor on four sides, wherein the second MOS transistor is not surrounded by the pick up diffusion region, the pick up diffusion region including* a third region of the first conductivity type between [the] *a* source side of said first regions and [the] *a* source side of said second regions [for surrounding said first MOS transistor with an additional pick up diffusion] to further restrain [the] *a* turn on speed of said first MOS transistor.

4. A semiconductor structure for electrostatic discharge (ESD) protection of a metal oxide semiconductor (MOS) integrated circuit, *said semiconductor structure* comprising:

a p type substrate [of forming] *that forms* a base for said semiconductor structure;

a first N+ region within said substrate [for forming] *that forms* a drain of a first MOS transistor;

a second N+ region within said substrate [for forming] *that forms* a source of the first MOS transistor;

a third N+ region within said substrate [for forming] *that forms* a source of a second MOS transistor, *and*

*a P+ region forming a pick up diffusion region having a first portion that surrounds said first MOS transistor laterally and does not surround the second MOS transistor,* wherein [a] *the* P+ region is disposed between the second N+ region of said first MOS transistor and the third N+ region of said second MOS transistor [for surrounding said first MOS transistor with an additional] *to provide a side of the* pick up diffusion to restrain the turn on speed of said first MOS transistor, and wherein [the] *a* channel length of said first MOS transistor is longer than [the] *a* channel length of said second MOS transistor to increase a drain base breakdown voltage of said first MOS transistor.

5. A semiconductor structure for electrostatic discharge (ESD) protection of a metal oxide semiconductor (MOS) integrated circuit, *said semiconductor structure* comprising:

a p type substrate [of forming] *that forms* a base for said semiconductor structure;

a first N+ region within said substrate [for forming] *that forms* a drain of a first MOS transistor;

a second N+ region within said substrate [for forming] *that forms* a source of the first MOS transistor;

a third N+ region within said substrate [for forming] *that forms* a source of a second MOS transistor, *and*

*a P+ region that forms a pick up diffusion region, wherein a first portion of the pick up diffusion region surrounds said first MOS transistor on four sides, wherein said second MOS transistor is not located within the first portion of the pick up diffusion region,* wherein a *side of the* P+ region is disposed between the second N+ region of said first MOS transistor and the third N+ region of said second MOS transistor for [surrounding said first MOS transistor with an additional pick up] *providing a portion of the pick up* diffusion [to] *region for* [restrain] *restraining* [the] *a* turn on speed of said first MOS transistor;

a first n channel region having a first channel length and disposed between said first and second regions of said first MOS transistor; and a second n channel region having a second channel length disposed adjacent to said third region of said second MOS transistor, wherein said first channel length is longer than said second channel length to further increase [the] *a* drain base breakdown voltage of said first MOS transistor.

6. A semiconductor structure for electrostatic discharge (ESD) protection of a metal oxide semiconductor (MOS) integrated circuit, *said semiconductor structure* comprising:

a p type substrate [forming] *that forms* a base for said semiconductor structure;

a pair of first N+ regions within said substrate [for defining] *that defines* a first n channel region for a first MOS transistor;

a pair of second N+ regions within said substrate [for defining] *that defines* a second n channel region for a second MOS transistor, wherein [the] *a* channel length of said first channel is greater than [the] *a* channel length of said second channel; and a [third] P+ region *that defines first and second pick up diffusion regions, wherein said first pick up diffusion region surrounds said first MOS transistor laterally and wherein said second pick up diffusion region surrounds said second MOS transistor laterally, wherein a portion of the P+ region is part of said first and said second pick up diffusion regions and is disposed* between [the] *a* source region of said first N+ regions and [the] *a* source region of said second N+ regions [for surrounding said] *to separate the* first MOS transistor *from the second MOS transistor and for providing said first MOS transistor* with [an additional] *the first* pick up diffusion to further restrain [the] *a* turn on of said first MOS transistor.

7. A semiconductor structure for electrostatic discharge (ESD) protection of a metal oxide semiconductor (MOS) integrated circuit, said semiconductor structure connected between an input pad and an internal circuit of said integrated circuit, *said semiconductor structure* comprising:

a substrate of a first conductivity type [forming] *that forms* a base for said semiconductor structure;

a first channel formed between a pair of first regions of a second conductivity type within said substrate for a first MOS transistor; and a second channel formed between [formed between] a pair of second regions of a second conductivity type within said substrate for a second MOS transistor, *and*

[wherein an additional] *a* pick up diffusion region *that laterally surrounds an area that includes said first MOS transistor and does not include said second MOS transistor, wherein a portion of the pick up diffusion region* is disposed between the source region of said first regions and the source region of said second regions [for surrounding said first MOS transistor with an additional] *to provide a portion of the* pick up diffusion [to] *for* [restrain ] *restraining* [the] *a* turn on of said first MOS transistor, wherein [the] *a* channel length of said first channel is longer than [the] *a* channel length of said second channel to increase a drain base breakdown voltage of said first MOS transistor.

8. A semiconductor structure for electrostatic discharge (ESD) protection of [a] high voltage tolerant I/O cells with stacked NMOS or PMOS integrated circuit, said semiconductor structure connected between a pre driver circuit and an input/output pad of said integrated circuit [and], *said semiconductor structure* comprising:

a substrate of a first conductivity type forming a base for said semiconductor structure;

a first channel formed between a pair of first regions of a second conductivity type within said substrate for a first MOS transistor [which is stacked on a third MOSFET of a second conductivity type]; and a second channel formed between a pair of second regions of a second conductivity type within said substrate for a second MOS transistor [which is stacked on a fourth MOSFET of a second conductivity type, wherein], *wherein a channel length of said first channel is longer than a channel length of said second channel to increase a drain base breakdown voltage of said first MOS transistor;*

[an additional] *a* pick up diffusion region [is disposed between the source region of said first regions and the source of said second regions for surrounding] *having a first portion that surrounds* said first MOS transistor [with an additional] *in plan view, and having a second portion that surrounds said second MOS transistor in plan view, wherein the first and second portions of the* pick up diffusion [to] *region have a common part for* [restrain] *restraining* the turn on of said first MOS transistor, *the common part being disposed between a source region of said first regions and a source of said second regions, wherein part of the first portion of the pick up diffusion region is not part of the second portion of the pick up diffusion region, and wherein part of the second portion of the pick up diffusion region is not part of the first portion of the pick up diffusion region.*

[9. The semiconductor structure of claim 8, wherein the channel length of said first channel is longer than the channel length of said second channel to increase the drain base breakdown voltage of said first MOS transistor.]

*10. An apparatus for electrostatic discharge protection of a metal oxide semiconductor (CMOS) circuit, said apparatus comprising:*

*a semiconductor substrate;*

*a first MOS type transistor disposed on said semiconductor substrate; and*

*a second MOS type transistor disposed proximate to said first MOS type transistor on said semiconductor substrate, and*

*a pick up diffusion region having a first portion that laterally surrounds an area including said first MOS transistor and excluding said second MOS transistor, wherein the pick up diffusion region has a second portion that laterally surrounds said second MOS transistor, wherein said first and second portions share a common side of said pick up diffusion region that is disposed between a source of the first MOS type transistor and a source of the second MOS type transistor;*

*wherein a channel length of said first MOS type transistor is longer than a channel length of said second MOS type transistor such that a drain-base voltage of said first MOS type transistor is increased with respect to a drain-base voltage of said second MOS type transistor.*

*11. A semiconductor structure for electrostatic discharge (ESD) protection of a metal oxide semiconductor (MOS) integrated circuit, said semiconductor structure comprising:*

*a substrate of a first conductivity type that forms a base for said semiconductor structure;*

*a first region of a second conductivity type within said substrate that forms a drain of a first MOS transistor;*

*a second region of the second conductivity type within said substrate that forms a source of the first MOS transistor;*

*means for restraining the turn on of said first MOS transistor, said means for restraining surrounding said first MOS transistor on four sides;*

*a first channel region disposed between said first and second regions of said first MOS transistor; and*

*a second channel region disposed adjacent to a third region of a second MOS transistor that forms a source of the second MOS transistor, wherein a first channel length of said first channel region is longer than a channel length of said second channel region to increase a drain-base breakdown voltage of said first MOS transistor;*

*wherein the means for restraining is disposed between the second region and the third region.*

* * * * *

UNITED STATES PATENT AND TRADEMARK OFFICE

CERTIFICATE OF CORRECTION

PATENT NO. : RE43,215 E
APPLICATION NO. : 11/598154
DATED : February 28, 2012
INVENTOR(S) : Ker et al.

It is certified that error appears in the above-identified patent and that said Letters Patent is hereby corrected as shown below:

Column 10, line 50, in Claim 1, delete "drain base voltage" and insert -- drain base *breakdown* voltage --.

Column 11, line 66, in Claim 4, delete "diffusion" and insert -- diffusion *region* --.

Column 11, line 66, in Claim 4, delete "the turn on" and insert -- [the] *a* turn on --.

Column 12, line 62, in Claim 6, delete "diffusion" and insert -- diffusion *region* --.

Column 13, line 15, in Claim 7, delete "the source" and insert -- [the] *a* source --.

Column 13, line 16, in Claim 7, delete "the source" and insert -- [the] *a* source --.

Column 13, line 53, in Claim 8, delete "the turn on" and insert -- [the] *a* turn on --.

Column 14, line 11, in Claim 10, delete "*metal oxide semiconductor (CMOS)*" and insert -- *metal oxide semiconductor (MOS)* --.

Column 14, line 42, in Claim 11, delete "*the turn on*" and insert -- *a turn on* --.

Column 14, lines 51-52, in Claim 11, delete "*drain-base breakdown voltage*" and insert -- *drain base breakdown voltage* --.

Signed and Sealed this
Eighteenth Day of September, 2012

David J. Kappos

David J. Kappos
*Director of the United States Patent and Trademark Office*